United States Patent
Hong et al.

(10) Patent No.: US 10,866,855 B2
(45) Date of Patent: Dec. 15, 2020

(54) MEMORY SYSTEM VARYING OPERATION OF MEMORY CONTROLLER ACCORDING TO INTERNAL STATUS OF MEMORY DEVICE

(71) Applicant: SAMSUNG ELECTRONICS CO., LTD., Suwon-si (KR)

(72) Inventors: Hyejeong Hong, Suwon-si (KR); Sanguhn Cha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 161 days.

(21) Appl. No.: 16/024,941

(22) Filed: Jul. 2, 2018

(65) Prior Publication Data

US 2019/0179699 A1  Jun. 13, 2019

(30) Foreign Application Priority Data

Dec. 12, 2017 (KR) .................. 10-2017-0170426

(51) Int. Cl.
| | |
|---|---|
| *G06F 11/00* | (2006.01) |
| *G06F 11/10* | (2006.01) |
| *H03M 13/09* | (2006.01) |
| *G06F 3/06* | (2006.01) |
| *G11C 7/10* | (2006.01) |
| *G06F 13/16* | (2006.01) |

(52) U.S. Cl.
CPC .......... *G06F 11/1048* (2013.01); *G06F 3/064* (2013.01); *G06F 3/0679* (2013.01); *G06F 11/1012* (2013.01); *G06F 11/1076* (2013.01); *G06F 13/1668* (2013.01); *G06F 13/1694* (2013.01); *G11C 7/1006* (2013.01); *H03M 13/09* (2013.01)

(58) Field of Classification Search
CPC .. G06F 11/1048; G06F 3/064; G06F 11/1012; G06F 13/1694; G11C 7/1006
See application file for complete search history.

(56) References Cited

U.S. PATENT DOCUMENTS

| | | | | |
|---|---|---|---|---|
| 7,539,926 B1 * | 5/2009 | Lesea | .................. | G06F 11/1004 714/758 |
| 8,341,498 B2 * | 12/2012 | D'Abreu | ............. | G06F 11/1048 714/760 |
| 8,495,465 B1 * | 7/2013 | Anholt | .................. | H03M 13/29 714/763 |
| 8,694,857 B2 | 4/2014 | Wang et al. | | |

(Continued)

*Primary Examiner* — Esaw T Abraham
(74) *Attorney, Agent, or Firm* — Volentine, Whitt & Francos, PLLC

(57) ABSTRACT

A memory system includes a memory device and a memory controller. The memory device outputs data in response to a read command. The memory device includes a first function circuit which performs a first operation based on data stored in the memory device, in response to the read command, to generate first processed data. The memory controller provides the read command to the memory device in response to a read request received from a host. The memory controller receives status information associated with performing the first operation. The memory controller includes a second function circuit which performs a second operation based on the first processed data to generate second processed data. A manner of the second operation varies based on the status information.

20 Claims, 19 Drawing Sheets

(56) References Cited

U.S. PATENT DOCUMENTS

| | | | |
|---|---|---|---|
| 8,738,993 B2 | 5/2014 | Bains | |
| 8,874,994 B2 * | 10/2014 | Sharon | G06F 11/1072 |
| | | | 714/766 |
| 8,891,303 B1 * | 11/2014 | Higgins | G11C 16/0483 |
| | | | 365/185.1 |
| 8,938,656 B2 * | 1/2015 | Liu | G06F 11/1012 |
| | | | 714/763 |
| 8,996,869 B1 | 3/2015 | Saxena et al. | |
| 8,996,960 B1 | 3/2015 | Saxena et al. | |
| 9,037,941 B2 * | 5/2015 | Dong | G06F 11/1012 |
| | | | 714/755 |
| 9,142,261 B2 * | 9/2015 | D'Abreu | G06F 13/1668 |
| 9,606,928 B2 * | 3/2017 | Eguchi | G06F 12/0868 |
| 9,691,505 B2 | 6/2017 | Das et al. | |
| 9,798,475 B2 * | 10/2017 | Kamimura | G06F 3/0616 |
| 10,452,474 B2 * | 10/2019 | Lin | G06F 3/0619 |
| 2013/0198587 A1 | 8/2013 | Kim et al. | |
| 2014/0245105 A1 | 8/2014 | Chung et al. | |
| 2015/0067437 A1 | 3/2015 | Bains et al. | |
| 2016/0062830 A1 | 3/2016 | Cha et al. | |
| 2016/0132265 A1 | 5/2016 | Yi et al. | |
| 2016/0266966 A1 | 9/2016 | Moschiano et al. | |
| 2016/0283318 A1 | 9/2016 | Das et al. | |
| 2017/0060676 A1 | 3/2017 | Kodera et al. | |

\* cited by examiner

FIG. 6

| | The number of error bits in memory device | The number of error bits in memory controller | External SEC/DED ECC Circuit |
|---|---|---|---|
| Without internal SEC ECC circuit | 1 | 1 | Correctable |
| | 2 | 2 | Detectable |
| With internal SEC ECC circuit | 1 | 0 | No error |
| | 2 | 2 | Detectable |
| | | 3 | Uncorrectable Undetectable |

MEMORY SYSTEM VARYING OPERATION OF MEMORY CONTROLLER ACCORDING TO INTERNAL STATUS OF MEMORY DEVICE

CROSS-REFERENCE TO RELATED APPLICATIONS

This application claims priority under 35 U.S.C. § 119 to Korean Patent Application No. 10-2017-0170426 filed on Dec. 12, 2017, in the Korean Intellectual Property Office, the disclosure of which is incorporated herein by reference in its entirety.

TECHNICAL FIELD

The present disclosure relates to an electronic device, and more particularly, relates to configurations and operations of a memory system which stores and outputs data.

DISCUSSION OF RELATED ART

In recent years, various kinds of electronic devices are being used. An electronic device performs its own functions according to operations of electronic circuits included in the electronic device. A memory system may include various electronic circuits to store data and to output the stored data, and may be implemented on a single electronic device or over a plurality of electronic devices.

The memory system may perform various operations on data to be stored or data to be output. For example, the memory system may perform operations for encrypting/decrypting, compressing/decompressing, and converting data and detecting and correcting an error of data. According to such operations, the memory system may store and output data to be suitable for a request of a user.

Meanwhile, as various electronic devices are widely used and an amount of data and information increases, various requirements on the memory system is being requested. For example, a scale of a semiconductor fabrication process becomes smaller to store a large amount of data in a memory device on a small circuit area, and implementation of various functions is being required for stable and reliable data processing.

In addition, the user may use an electronic device under various conditions, and thus a memory system which provides flexible operations may be required. A memory system of a rigid configuration may not provide an appropriate function under a particular condition or may perform a wrong operation. Accordingly, implementing a memory system which operates flexibly according to a condition or a status may be an important issue.

SUMMARY

Example embodiments of the present disclosure may provide a memory system which is configured to flexibly vary an operation of a memory controller according to an internal status of a memory device.

In some example embodiments, a memory system may include a memory device and a memory controller. The memory device may output data in response to a read command. The memory device may include a first function circuit. The first function circuit may perform a first operation based on data stored in the memory device to generate first processed data, in response to the read command. The memory controller may provide the read command to the memory device in response to a read request received from a host, such that the data is output to the memory device. The memory controller may receive status information associated with performing the first operation. The memory controller may include a second function circuit. The second function circuit may perform a second operation based on the first processed data to generate second processed data. A manner of the second operation may vary based on the status information.

In some example embodiments, a memory system may include a memory device and a memory controller. The memory device may perform a first error processing operation based on data stored in the memory device to generate first processed data. The memory controller may receive status information associated with performing the first error processing operation. The memory controller may perform a second error processing operation based on the first processed data to generate second processed data. The maximum number of errors detected by the second error processing operation with regard to the first processed data may be greater than the maximum number of errors detected by the first error processing operation with regard to the stored data. A manner of the second error processing operation may vary based on the status information.

In some example embodiments, a memory system may include a memory device and a memory controller. The memory device may perform a first operation based on data stored in the memory device to generate first processed data. The memory controller may receive status information associated with performing the first operation. The memory controller may perform a second operation based on the first processed data to generate second processed data. The first processed data may be differently generated in the memory device in association with a change of the status information. A manner of the second operation may vary based on the status information. The second processed data may be differently generated in the memory controller according to the change of the status information.

In some example embodiments, a memory system may include a memory device and a memory controller. The memory controller may perform a function operation based on data received from the memory device to generate processed data. The memory controller may receive status information associated with an operation performed in the memory device. The memory controller may perform the function operation in a manner, which is selected based on the status information, from among different manners. As the status information is changed, the data received in the memory controller may be changed.

In some example embodiments, a memory system includes a memory device and a memory controller. The memory controller: (1) receives first data and status information from the memory device, wherein the first data represents second data stored by the memory device, (2) executes a first operation on the first data in response to determining the status information indicates a first status, (3) executes a second operation, which differs from the first operation, on the first data in response to determining the status information indicates a second status, and (4) communicates processed data to an external host, the processed data representing the second data and devoid of errant information or representing a report of the errant information.

According to some example embodiments, a memory system may differently operate according to a condition or a status, and an operation may be performed to be suitable for a given condition or status. In some example embodiments, an undetectable and uncorrectable error may be prevented from occurring, and operation performance and power consumption may be managed. Accordingly, stability, reliability, and flexibility of an operation of the memory system may be improved.

BRIEF DESCRIPTION OF THE DRAWINGS

The above and other objects and features of the present disclosure will become apparent from the following descriptions with reference to the accompanying figures.

FIG. 6 is a table for describing an error processing operation performed in a memory system of FIG. 5.

DETAILED DESCRIPTION OF EXAMPLE EMBODIMENTS

Below, some example embodiments will be described in detail and clearly with reference to accompanying drawings such that those skilled in the art can easily implement the present disclosure.

Figure 1:
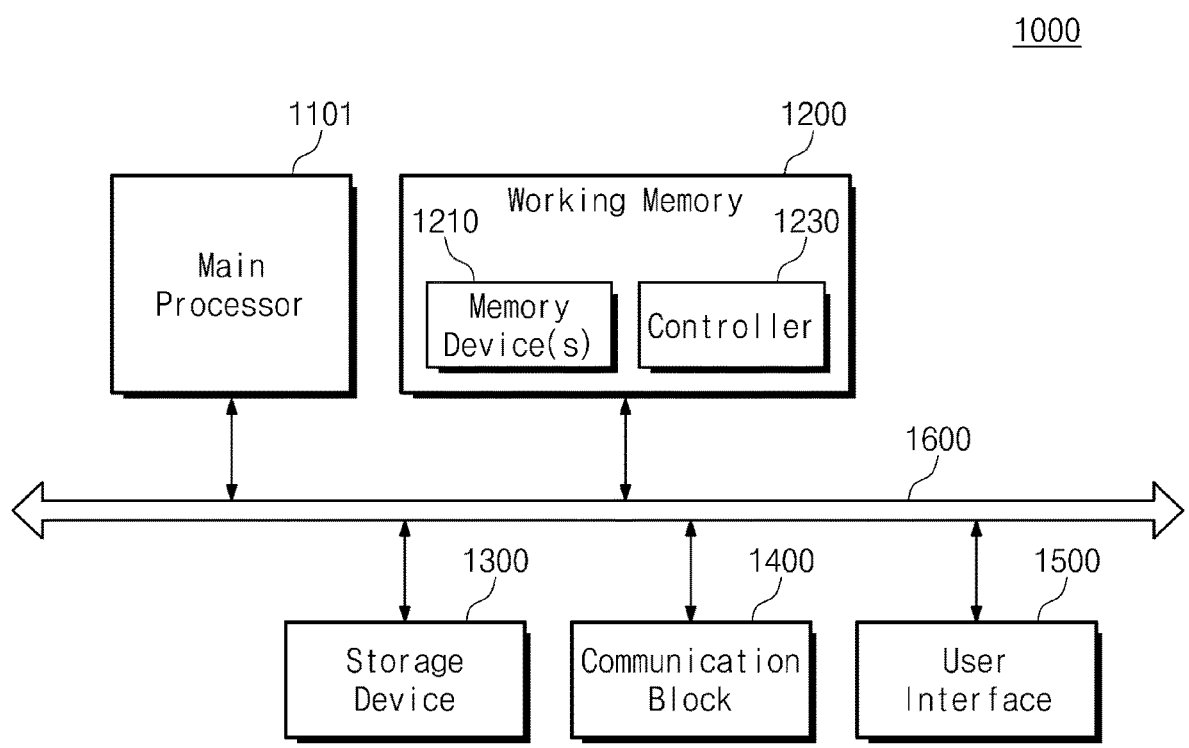
FIG. 1 is a block diagram illustrating an example configuration of an electronic system according to some example embodiments.

FIG. 1 is a block diagram illustrating an example configuration of an electronic system 1000 according to some example embodiments.

The electronic system 1000 may include a main processor 1101, a working memory 1200, a storage device 1300, a communication block 1400, a user interface 1500, and a bus 1600. For example, the electronic system 1000 may be one of electronic devices such as a desktop computer, a laptop computer, a tablet computer, a smart phone, a wearable device, a video game console, a workstation, one or more servers, an electric vehicle, home appliances, a medical device, and the like.

The main processor 1101 may control overall operations of the electronic system 1000. For example, the main processor 1101 may be implemented with a general-purpose processor, a special-purpose processor, or an application processor, which includes one or more processor cores.

The working memory 1200 may store data used in an operation of the electronic system 1000. For example, the working memory 1200 may temporarily store data processed or to be processed by the main processor 1101. For example, the working memory 1200 may include a volatile memory such as a static random access memory (SRAM), a dynamic RAM (DRAM), and/or a synchronous DRAM (SDRAM), and/or a nonvolatile memory such as a phase-change RAM (PRAM), a magneto-resistive RAM (MRAM), a resistive RAM (ReRAM), and/or a ferroelectric RAM (FRAM).

For example, the working memory 1200 may include one or more memory devices 1210 and a controller 1230. The memory devices 1210 may include memory elements to store or output data. The number of the memory devices 1210 may be variously changed or modified to be suitable for the requirement of the electronic system 1000.

The controller 1230 may control the memory devices 1210 such that the memory devices 1210 store or output data. The controller 1230 may perform various function operations, based on data to be stored in the memory devices 1210 and data output from the memory devices 1210.

The storage device 1300 may store data regardless of power being supplied. For example, the storage device 1300 may include a nonvolatile memory device such as a flash memory, a PRAM, an MRAM, a ReRAM, an FRAM, and/or the like. For example, the storage device 1300 may include a storage medium such as a solid state drive (SSD), a card storage, an embedded storage, and/or the like.

The communication block 1400 may support at least one of various wireless/wired protocols to communicate with an external device/system of the electronic system 1000. The user interface 1500 may include various input/output interfaces to arbitrate in communication between a user and the electronic system 1000.

The bus 1600 may provide a communication path between components of the electronic system 1000. Components of the electronic system 1000 may exchange data with one another in compliance with a bus format of the bus 1600. For example, the bus format may include one or more of various interface protocols such as universal serial bus (USB), small computer system interface (SCSI), peripheral component interconnect express (PCIe), mobile PCIe (M-PCIe), serial advanced technology attachment (SATA), serial attached SCSI (SAS), nonvolatile memory express (NVMe), universal flash storage (UFS), double data rate (DDR), low power DDR (LPDDR), and/or the like.

Figure 2:
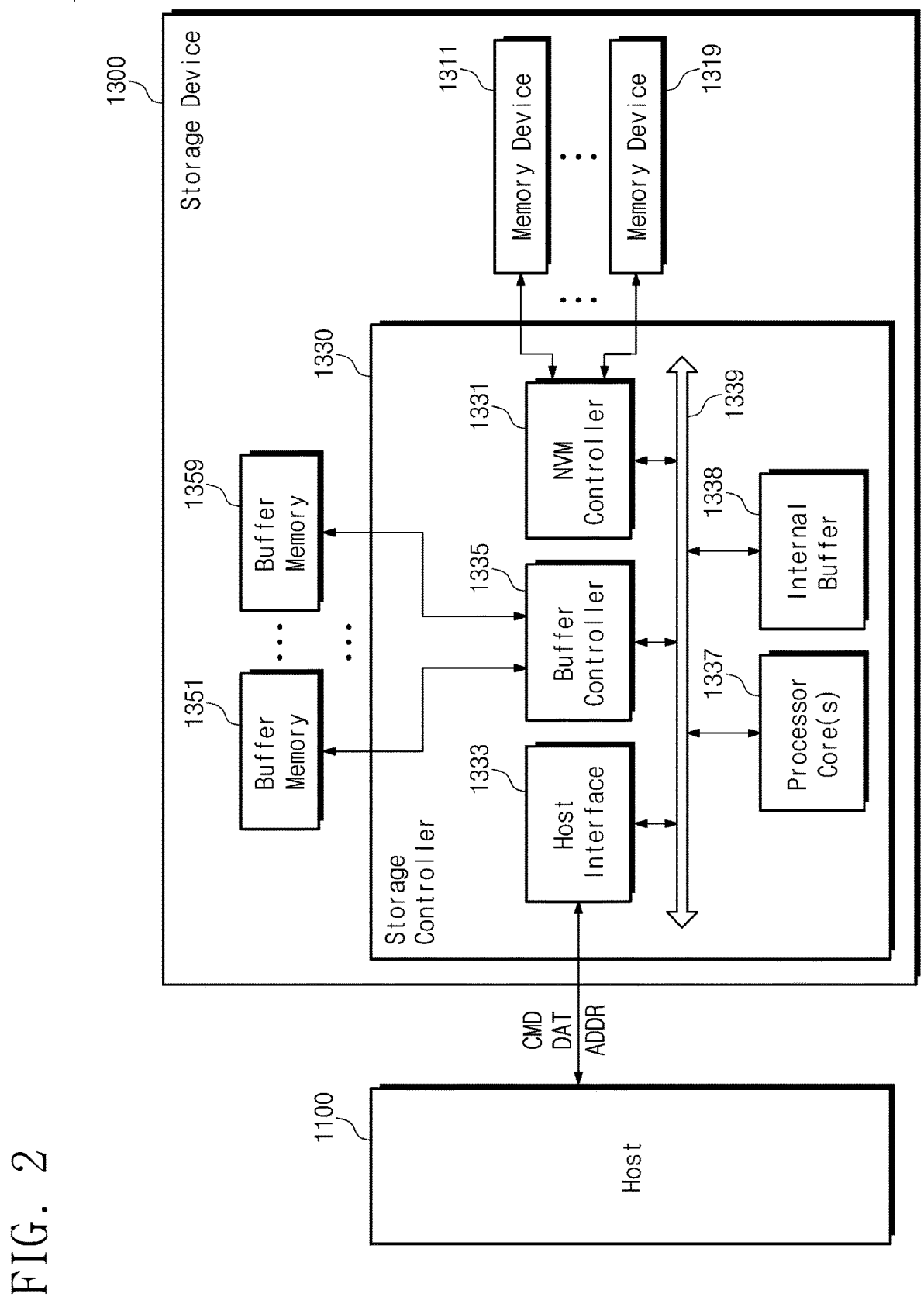
FIG. 2 is a block diagram illustrating an example configuration associated with a storage device of FIG. 1.

FIG. 2 is a block diagram illustrating an example configuration of the storage device 1300 of FIG. 1.

As described with reference to FIG. 1, the main processor 1101 may communicate with the working memory 1200 and the storage device 1300 through the bus 1600. In the present disclosure, an object which is capable of accessing a component (e.g., the working memory 1200, the storage device 1300, or the like) of the electronic system 1000 may be referred to as a "host" (e.g., a host 1100). The main processor 1101 may be an example of objects which are able to operate as the host 1100. However, the present disclosure is not limited thereto.

The host 1100 may exchange data DAT with the storage device 1300. The storage device 1300 may provide a storage service to the host 1100 in response to a command CMD received from the host 1100.

For example, the host 1100 may provide the storage device 1300 with the command CMD including a write request and the data DAT including write data. The storage device 1300 may store the requested write data in response to the write request. For example, the host 1100 may provide the storage device 1300 with the command CMD including a read request. The storage device 1300 may output requested read data to the host 1100 in response to the read request.

The storage device 1300 may include one or more memory devices 1311 and 1319, a storage controller 1330, and one or more buffer memories 1351 and 1359. For example, FIG. 2 illustrates two memory devices 1311 and 1319 and two buffer memories 1351 and 1359, but the number of memory devices and the number of buffer memories included in the storage device 1300 may be variously changed or modified.

Each of the memory devices 1311 and 1319 may store or output data requested by the host 1100. To this end, each of the memory devices 1311 and 1319 may include a memory area for storing data.

The memory area may be identified based on a value referred to as an "address". The host 1100 may provide an address ADDR to the storage device 1300 to exchange the data DAT in association with a specific memory area of the memory devices 1311 and 1319. The write data may be stored in a memory area identified by the address ADDR, and the read data may be output from a memory area identified by the address ADDR.

The buffer memories 1351 and 1359 may buffer data used in an operation of the storage device 1300. For example, the buffer memories 1351 and 1359 may store address translation information which is referenced to perform translation between the address ADDR provided from the host 1100 and a physical address on the memory devices 1311 and 1319. For example, the buffer memories 1351 and 1359 may store error correction code (ECC) information which is referenced to detect and correct an error of data output from the memory devices 1311 and 1319. To this end, the buffer memories 1351 and 1359 may include a volatile memory such as an SRAM, a DRAM, an SDRAM, and/or the like, and/or a nonvolatile memory such as a PRAM, an MRAM, a ReRAM, an FRAM, and/or the like.

The storage controller 1330 may control overall operations of the storage device 1300. To this end, for example, the storage controller 1330 may include a nonvolatile memory (NVM) controller 1331, a host interface circuit 1333, a buffer controller 1335, one or more processor cores 1337, an internal buffer 1338, and an on-chip bus 1339.

The nonvolatile memory controller 1331 may provide interfacing with the memory devices 1311 and 1319. The nonvolatile memory controller 1331 may control the memory devices 1311 and 1319 such that the memory devices 1311 and 1319 store or output data. The nonvolatile memory controller 1331 may perform various function operations, based on data to be stored in the memory devices 1311 and 1319 and data output from the memory devices 1311 and 1319.

The host interface circuit 1333 may provide interfacing with the host 1100. The host interface circuit 1333 may perform suitable conversion between a format of the command CMD, the data DAT, and the address ADDR received from the host 1100 and a format managed/used in the storage controller 1330.

The buffer controller 1335 may provide interfacing with the buffer memories 1351 and 1359. The buffer controller 1335 may control the buffer memories 1351 and 1359 such that the buffer memories 1351 and 1359 store or output data. The buffer controller 1335 may perform various function operations, based on data to be stored in the buffer memories 1351 and 1359 and data output from the buffer memories 1351 and 1359.

Components of the storage controller 1330 may include one or more hardware components (e.g., an analog circuit, a logic circuit, and/or the like) which are configured to perform operations described above and to be described below.

In addition, the storage controller 1330 may include the one or more processor cores 1337. Operations of components of the storage controller 1330 described above and to be described below may be implemented with a program code of software and/or firmware, and the processor cores 1337 may execute an instruction set of the program code. The processor cores 1337 may process various arithmetic/logical operations to execute the instruction set.

The internal buffer 1338 may store data processed or to be processed by the processor cores 1337. The internal buffer 1338 may temporarily store the data DAT, the command CMD, and the address ADDR received from the host 1100. The internal buffer 1338 may temporarily store data output from the memory devices 1311 and 1319. For example, the internal buffer 1338 may include a volatile memory such as an SRAM, a DRAM, an SDRAM, and/or the like, and/or a nonvolatile memory such as a PRAM, an MRAM, a ReRAM, an FRAM, and/or the like.

The on-chip bus 1339 may provide a communication path between components of the storage controller 1330. To this end, the on-chip bus 1339 may support one or more interface protocols, and may make a physical signal transmitted through a conductive material.

Figure 3:
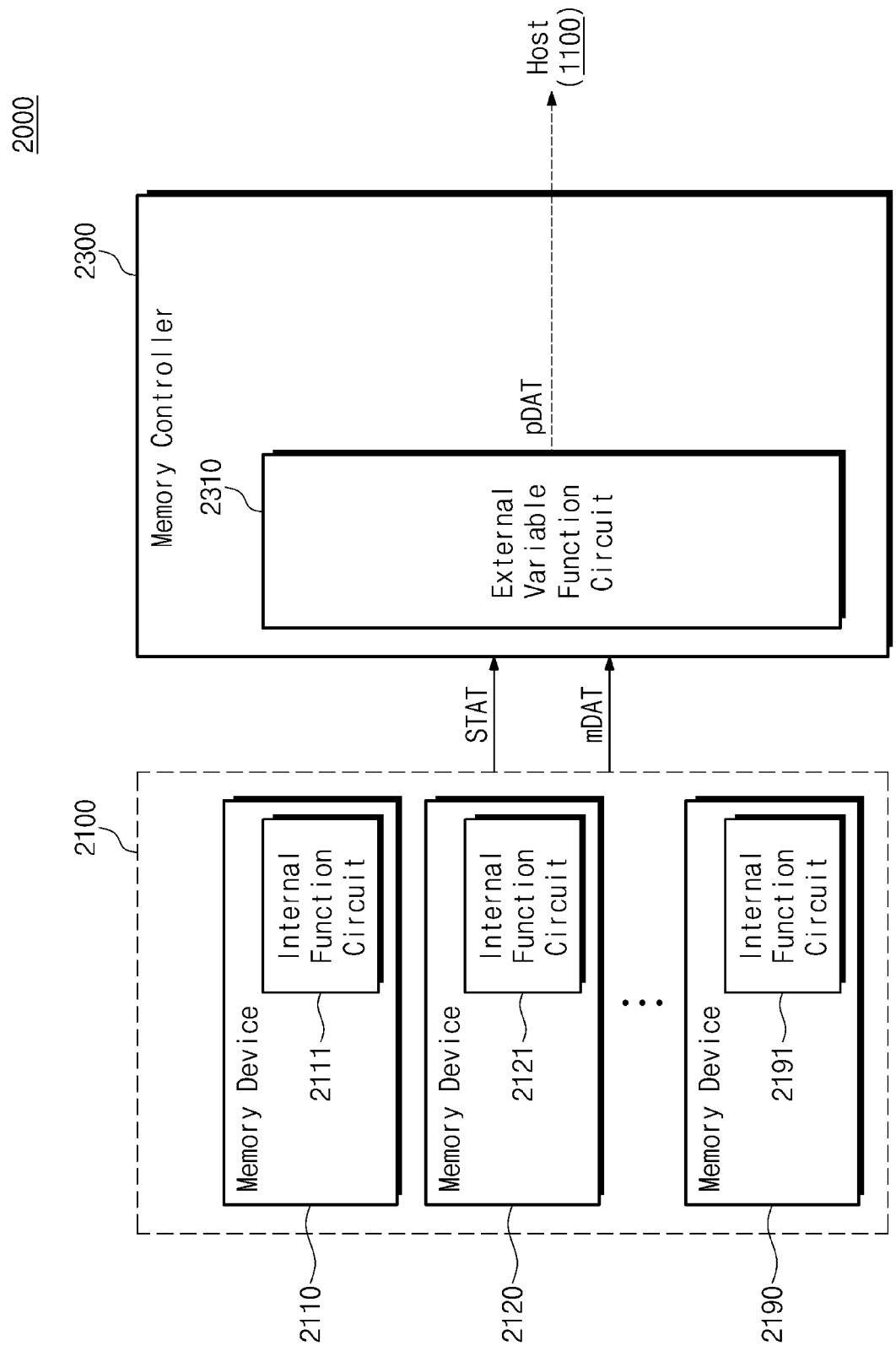
FIG. 3 is a block diagram illustrating an example configuration of a memory system according to some example embodiments.

FIG. 3 is a block diagram illustrating an example configuration of a memory system 2000 according to some example embodiments.

The memory system 2000 may include one or more memory devices 2100 and a memory controller 2300. FIG. 3 illustrates three memory devices 2110, 2120, and 2190, but the number of memory devices included in the memory system 2000 may be variously changed or modified.

The memory system 2000 may be implemented on a single electronic device. Alternatively, the memory system 2000 may be implemented over a plurality of electronic devices, or may be implemented with a plurality of chips.

For example, the memory system 2000 may be implemented with the working memory 1200 of FIG. 1, and the memory devices 2110, 2120, and 2190 and the memory controller 2300 may correspond to the memory devices 1210 and the controller 1230 of FIG. 1. In some cases, the memory system 2000 may be implemented within the storage device 1300 of FIG. 2. For example, the memory devices 2110, 2120, and 2190 and the memory controller 2300 may correspond to the memory devices 1311 and 1319 and the nonvolatile memory controller 1331 of FIG. 2. For example, the memory devices 2110, 2120, and 2190 and the memory controller 2300 may correspond to the buffer memories 1351 and 1359 and the buffer controller 1335 of FIG. 2.

The above examples describe some of possible example embodiments to facilitate better understanding, and are not intended to limit the present disclosure. The memory system 2000 may be implemented with any configuration including one or more memory devices for storing data and a memory controller for controlling the memory devices. Below, some example embodiments will be described with regard to a specific type of memory (e.g., a DRAM or a flash memory), but it may be readily understood that these example embodiments may be employed for any type of memory.

Each of the memory devices 2110, 2120, and 2190 may store data. Each of the memory devices 2110, 2120, and 2190 may output stored data, in response to a read command received from the memory controller 2300. The memory controller 2300 may provide the read command to a memory device, in which requested data is stored, in response to the command CMD of the read request received from the host 1100. Accordingly, the requested data may be output from the corresponding memory device. Each of the memory devices 2110, 2120, and 2190 may be implemented on one semiconductor memory chip or die.

The memory devices 2110, 2120, and 2190 may include internal function circuits 2111, 2121, and 2191 respectively. The internal function circuits 2111, 2121, and 2191 may be provided within the memory devices 2110, 2120, and 2190 respectively. In the present disclosure, each of the internal function circuits 2111, 2121, and 2191 may also be referred to as a "first function circuit".

The internal function circuits 2111, 2121, and 2191 may perform a first operation based on data stored in the respective memory devices 2110, 2120, and 2190. Each of the internal function circuits 2111, 2121, and 2191 may perform the first operation in response to the read command received from the memory controller 2300. The memory devices 2110, 2120, and 2190 may perform the first operation by the internal function circuits 2111, 2121, and 2191, to generate first processed data mDAT.

The first operation may include one or more of various types of operations, and a function of each of the internal function circuits 2111, 2121, and 2191 may be determined depending on a type of the first operation. For example, the first operation may include all or some of an error processing operation (e.g., an error detection operation, an error correction operation, and/or the like), an encryption/decryption operation, a compression/decompression operation, an encoding/decoding operation, and/or the like. The functions of the internal function circuits 2111, 2121, and 2191 may be identical to or different from one another.

The memory controller 2300 may control the memory devices 2110, 2120, and 2190 such that the memory devices 2110, 2120, and 2190 store or output data. To this end, the memory controller 2300 may perform various operations. For example, the memory controller 2300 may include an external variable function circuit 2310. The external variable function circuit 2310 may be provided outside the memory devices 2110, 2120, and 2190. In the present disclosure, the external variable function circuit 2310 may also be referred to as a "second function circuit".

The memory controller 2300 may receive the first processed data mDAT from the memory devices 2110, 2120, and 2190. The external variable function circuit 2310 may perform a second operation based on the first processed data mDAT. The memory controller 2300 may perform the second operation by the external variable function circuit 2310, to generate second processed data pDAT.

The second operation may include one or more of various types of operations, and a function of the external variable function circuit 2310 may be determined depending on a type of the second operation. For example, the second operation may include all or some of an error processing operation (e.g., an error detection operation, an error correction operation, and/or the like), an encryption/decryption operation, a compression/decompression operation, an encoding/decoding operation, and/or the like.

The function of the external variable function circuit 2310 may be identical to or different from the functions of the internal function circuits 2111, 2121, and 2191. In other words, the type of the second operation may be identical to or different from the type of the first operation.

When the type of the second operation is identical to the type of the first operation, capability of the external variable function circuit 2310 may be different from capability of each of the internal function circuits 2111, 2121, and 2191. For example, a circuit area of each of the memory devices 2110, 2120, and 2190 may be smaller than a circuit area of the memory controller 2300, and thus the capability of each of the internal function circuits 2111, 2121, and 2191 may be lower than the capability of the external variable function circuit 2310. For example, when the first operation and the second operation include an error detection operation, the maximum number of errors detected by each of the internal function circuits 2111, 2121, and 2191 may be smaller than the maximum number of errors detected by the external variable function circuit 2310.

As the read request is received from the host 1100, the memory controller 2300 may provide the read command to a memory device in which the requested data is stored. Accordingly, the memory device which has received the read command may perform the first operation by an internal function circuit. In addition, the memory controller 2300 may perform the second operation based on a result of the first operation.

The memory controller 2300 may receive status information STAT. The status information STAT may be associated with performing the first operation in each of the memory devices 2110, 2120, and 2190. For example, the status information STAT may include information associated with at least one of various conditions, e.g., whether the memory devices 2110, 2120, and 2190 include the internal function circuits 2111, 2121, and 2191 (i.e., whether each of the memory devices 2110, 2120, and 2190 supports the first operation), whether performing the first operation in each of the memory devices 2110, 2120, and 2190 is enabled, a type of the first operation, the capability of each of the internal function circuits 2111, 2121, and 2191, a condition of each of the memory devices 2110, 2120, and 2190 where the first operation is performed, and/or the like.

For example, depending on a design of the memory system 2000, the memory devices 2110, 2120, and 2190 may include or may not include the internal function circuits 2111, 2121, and 2191. For example, depending on an operation policy of the memory system 2000 or the host 1100, an operation of each of the internal function circuits 2111, 2121, and 2191 may be enabled or disabled. For example, the condition of each of the memory devices 2110, 2120, and 2190 where the first operation is performed may be associated with various factors such as a communication bandwidth, a device temperature, an expected remaining lifespan, and/or the like. The status information STAT may be provided to the memory controller 2300 to provide information associated with performing the first operation.

A change of the status information STAT (e.g., a change in enable/disable of each of the internal function circuits 2111, 2121, and 2191, a change in temperature of each of the memory devices 2110, 2120, and 2190, and/or the like) may mean a change associated with performing the first operation. Accordingly, when the status information STAT is changed, the first processed data mDAT may be generated in the memory devices 2110, 2120, and 2190 to be different from that before the status information STAT is changed (i.e., the first processed data mDAT generated in the memory devices 2110, 2120, and 2190 after the status information STAT is changed may be different from the first processed data mDAT generated in the memory devices 2110, 2120, and 2190 before the status information STAT is changed). For example, when the status information STAT is changed from first information to second information, context of the first processed data mDAT may be changed from first context to second context which is different from the first context. Therefore, as the status information STAT is changed, the first processed data mDAT received in the memory controller 2300 may be changed.

An operation of the external variable function circuit 2310 may vary based on the status information STAT, and a manner of the second operation may vary based on the status information STAT. Accordingly, when the status information STAT is changed, the manner of the second operation may be changed. For example, the manner of the second operation may be determined according to at least one of the type of the second operation and/or the capability of the second operation.

In some example embodiments, the external variable function circuit 2310 may perform the second operation in a manner, which is selected based on the status information STAT, from among different manners. For example, when the status information STAT is changed, the capability of the external variable function circuit 2310 may be changed from a first capability to a second capability. In some example embodiments, the external variable function circuit 2310 may perform the second operation of a type, which is selected based on the status information STAT, from among a plurality of different types of operations. For example, when the status information STAT is changed, the type of the second operation of the external variable function circuit 2310 may be changed from a first type to a second type. Some examples associated with a change of the status information STAT will be described with reference to FIGS. 7 to 15.

When the status information STAT is changed, the type or the manner of the second operation may be changed. Accordingly, when the status information STAT is changed, the second processed data pDAT may be generated in the memory controller 2300 to be different from that before the status information STAT is changed (i.e., before the type or the manner of the second operation is changed). In other words, the second processed data pDAT generated in the memory controller 2300 after the status information STAT is changed may be different from the second processed data pDAT generated in the memory controller 2300 before the status information STAT is changed. For example, when the status information STAT is changed from first information to second information, context of the second processed data pDAT may be changed from first context to second context which is different from the first context.

The memory controller 2300 may output the second processed data pDAT. Alternatively, the memory controller 2300 may output data which is generated by post-processing and/or converting the second processed data pDAT. Data output from the memory controller 2300 may include requested data corresponding to the read request of the host 1100. Accordingly, the memory controller 2300 may provide the requested data to the host 1100 based on the second processed data pDAT.

According to example embodiments, the memory controller 2300 (in particularly, the external variable function circuit 2310) may differently operate depending on an operation of the memory system 2000. Accordingly, an operation may be performed to be suitable for a given condition or status, and flexibility of the operation of the memory system 2000 may be improved.

Figure 4:
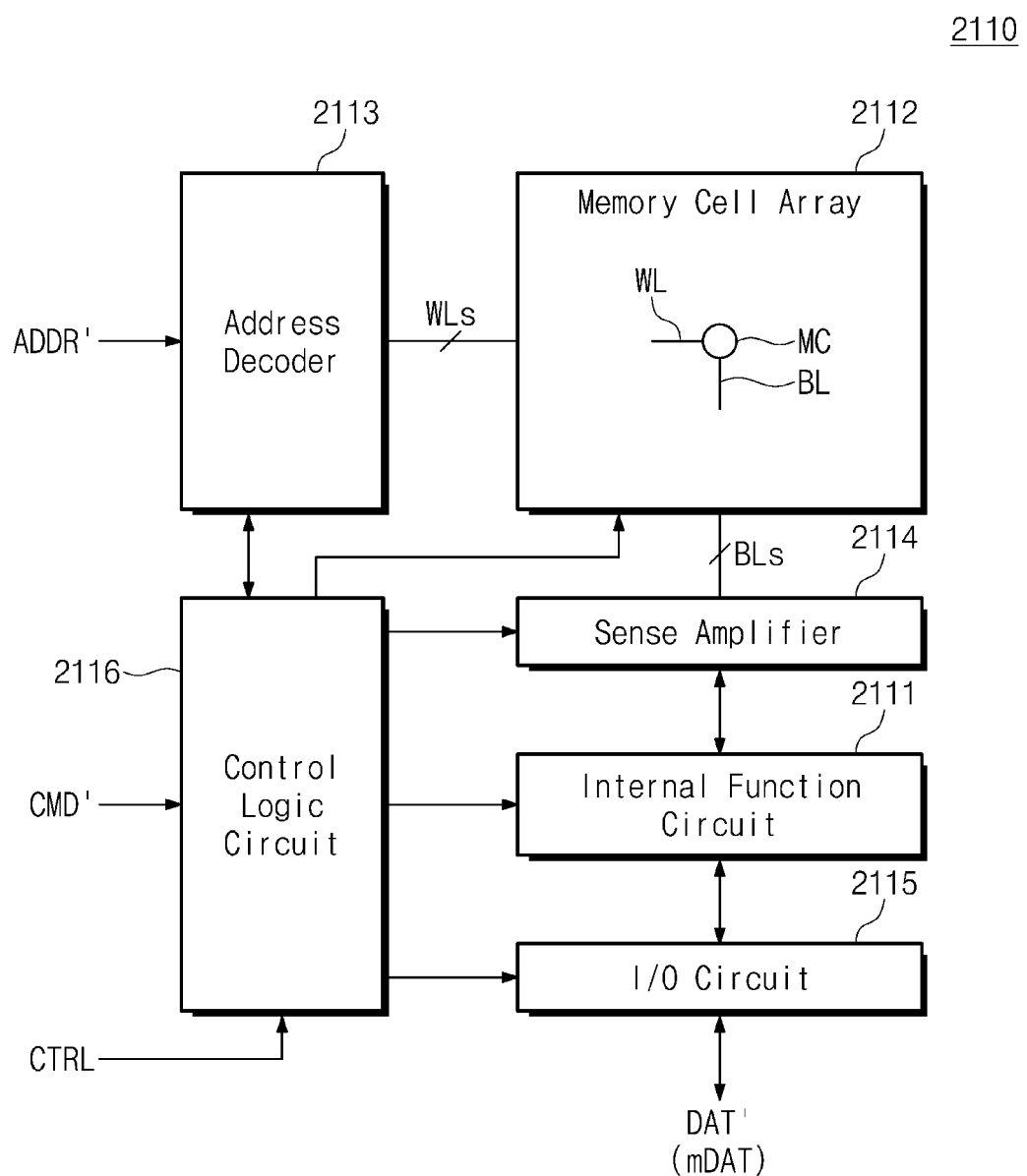
FIG. 4 is a block diagram illustrating an example configuration of a memory device of FIG. 3.

FIG. 4 is a block diagram illustrating an example configuration of the memory device 2110 of FIG. 3.

The memory device 2110 may include the internal function circuit 2111, a memory cell array 2112, an address decoder 2113, a sense amplifier 2114, an input/output circuit 2115, and a control logic circuit 2116. Each of other memory devices 2120 and 2190 may be configured to be identical or similar to the memory device 2110.

The memory cell array 2112 may include a plurality of memory cells (e.g., a memory cell MC). Each memory cell MC may be connected with a word line WL and a bit line BL. Each memory cell MC may store a data bit. Each memory cell MC may be a single level cell storing one bit or a multi-level cell storing at least two bits.

The address decoder 2113 may be connected with the memory cell array 2112 through word lines WLs. The address decoder 2113 may receive an address ADDR' from the memory controller 2300, and may decode the received address ADDR'. The address decoder 2113 may drive the word lines WLs based on the decoded address ADDR'.

The sense amplifier 2114 may be connected with the memory cell array 2112 through bit lines BLs. The sense amplifier 2114 may sense data read from the memory cell array 2112. The internal function circuit 2111 may perform the first operation based on the data sensed by the sense amplifier 2114.

The input/output circuit 2115 may manage data input/output of the memory device 2110 such that data DAT' is exchanged between the memory controller 2300 and the memory cell array 2112. For example, the first processed data mDAT may be generated by the first operation of the internal function circuit 2111, and the input/output circuit 2115 may output the first processed data mDAT to the memory controller 2300.

The control logic circuit 2116 may receive a command CMD' and a control signal CTRL from the memory controller 2300. The control logic circuit 2116 may control the internal function circuit 2111, the address decoder 2113, the sense amplifier 2114, and the input/output circuit 2115 based on the received signals.

Figure 5:
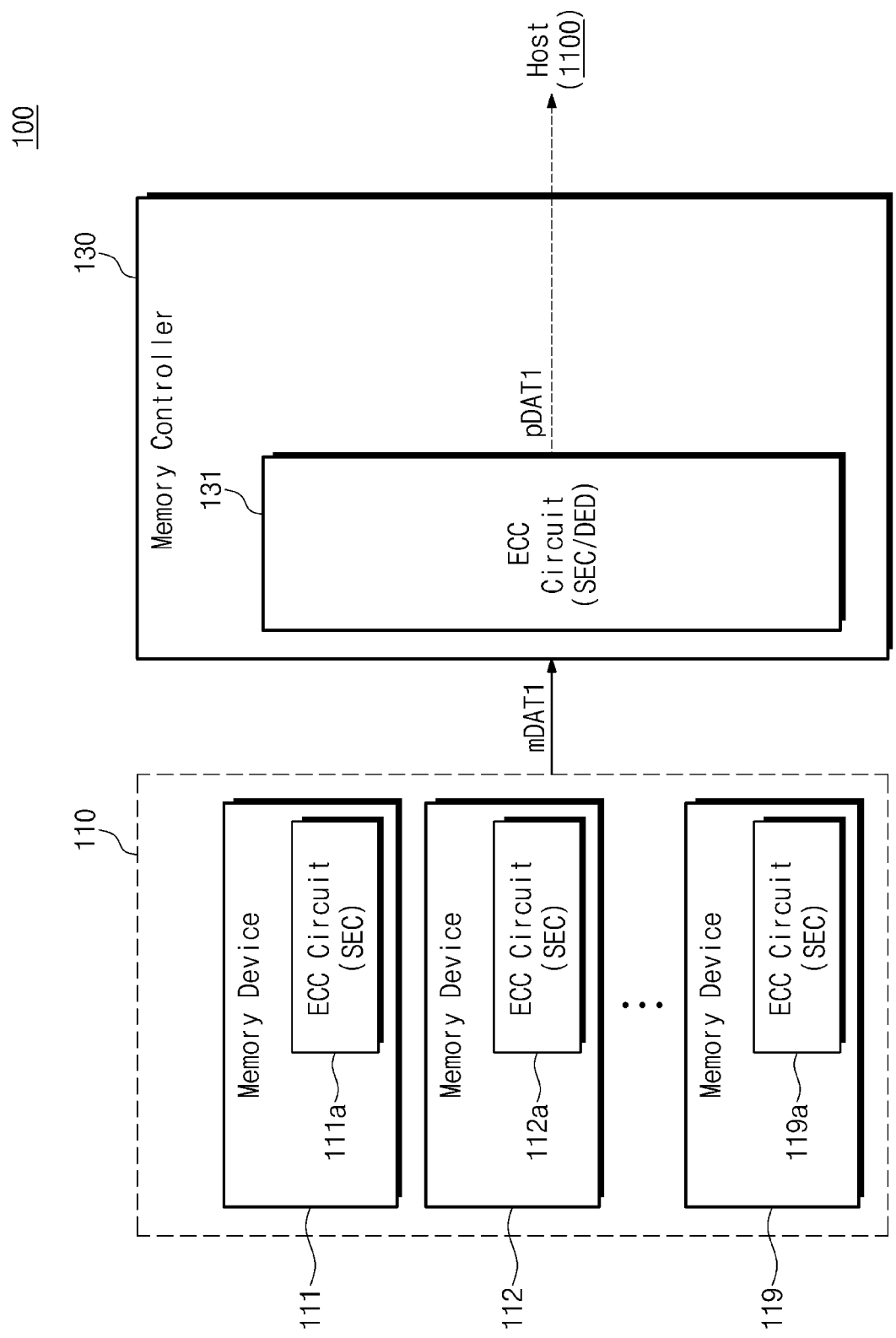
FIG. 5 is a block diagram illustrating an example configuration associated with a memory system of FIG. 3.

FIG. 5 is a block diagram illustrating an example configuration associated with the memory system 2000 of FIG. 3.

For example, the memory system 2000 may include a configuration such as a memory system 100 of FIG. 5. One or more memory devices 110 of FIG. 5 may correspond to the one or more memory devices 2100 of FIG. 3, and a memory controller 130 of FIG. 5 may correspond to the memory controller 2300 of FIG. 3. For brevity, redundant descriptions associated with the memory devices 110 and the memory controller 130 will be omitted below.

The memory devices 111, 112, and 119 may respectively include ECC circuits 111a, 112a, and 119a as the internal function circuits 2111, 2121, and 2191. Each of the ECC circuits 111a, 112a, and 119a may perform an error processing operation (e.g., error detection and error correction) based on data output from the respective memory devices 111, 112, and 119, in compliance with a given ECC scheme.

The memory devices 111, 112, and 119 may perform the error processing operation to generate first processed data mDAT1.

For example, each of the ECC circuits 111a, 112a, and 119a may operate in a single error correction (SEC) manner. In this case, each of the ECC circuits 111a, 112a, and 119a may detect and correct a 1-bit error of data output from the respective memory devices 111, 112, and 119, but may not be able to detect an error of two or more bits.

For example, the memory controller 130 may include an ECC circuit 131 of a rigid configuration, instead of including the external variable function circuit 2310. The ECC circuit 131 may perform an error processing operation (e.g., error detection and error correction) based on the first processed data mDAT1, in compliance with a given ECC scheme. The memory controller 130 may perform the error processing operation to generate second processed data pDAT1.

For example, the ECC circuit 131 may operate in a single error correction/double error correction (SEC/DED) manner. In this case, the ECC circuit 131 may detect and correct a 1-bit error of the first processed data mDAT1 and may detect a 1-bit or 2-bit error, but the ECC circuit 131 may not be able to detect an error of three or more bits.

For example, a scale of the semiconductor fabrication process may become smaller and smaller to store a large amount of data in the memory devices 111, 112, and 119 on a small circuit area, and an operation speed of the memory devices 111, 112, and 119 may become faster to process the large amount of data. For this reason, it is likely that data output from the memory devices 111, 112, and 119 may include an error.

Accordingly, the ECC circuits 111a, 112a, and 119a may be employed together with the ECC circuit 131 for stable and reliable data processing. However, in some cases, a circuit area of each of the memory devices 111, 112, and 119 may be small, and thus capability (e.g., the maximum number of detectable bits) of each of the ECC circuits 111a, 112a, and 119a may be lower than capability of the ECC circuit 131.

FIG. 6 is a table for describing an error processing operation performed in the memory system 100 of FIG. 5.

For example, unlike the illustration of FIG. 5, the memory devices 111, 112, and 119 may be configured without the ECC circuits 111a, 112a, and 119a of the SEC manner. When one (1) error bit occurs in the memory devices 111, 112, and 119, the memory controller 130 may receive the first processed data mDAT1 including the one error bit. In this case, the ECC circuit 131 may detect and correct the one error bit, and the memory controller 130 may generate the second processed data pDAT1 which is corrected without an error bit.

Meanwhile, when two (2) error bits occur in the memory devices 111, 112, and 119, the memory controller 130 may receive the first processed data mDAT1 including the two error bits. In this case, the ECC circuit 131 may detect the two error bits. The memory controller 130 may generate the second processed data pDAT1, and may inform the host 1100 that the two error bits occur.

For example, as illustrated in FIG. 5, the memory devices 111, 112, and 119 may be configured together with the ECC circuits 111a, 112a, and 119a of the SEC manner. When one error bit occurs in the memory devices 111, 112, and 119, the ECC circuits 111a, 112a, and 119a may detect and correct the one error bit. Accordingly, the memory controller 130 may receive the first processed data mDAT1 which is corrected without an error bit.

Meanwhile, two error bits may occur in the memory devices 111, 112, and 119. In some cases, the ECC circuits 111a, 112a, and 119a may not be able to detect and correct the two error bits, and thus the memory controller 130 may receive the first processed data mDAT1 including the two error bits. In this case, the ECC circuit 131 may detect the two error bits. The memory controller 130 may generate the second processed data pDAT1, and may inform the host 1100 that the two error bits occur.

However, in some cases, the ECC circuits 111a, 112a, and 119a may perform a wrong error processing operation on data which includes the two error bits. Due to the wrong error processing operation, data which has included the two error bits may be wrongly corrected to include three (3) error bits. Accordingly, the memory controller 130 may receive the first processed data mDAT1 including the three error bits. In this case, the ECC circuit 131 may not be able to correct and detect the three error bits.

As a result, the host 1100 may not recognize occurrence of an error and may receive wrong data, and reliability and stability may be degraded. As such, when the ECC circuits 111a, 112a, and 119a are employed within the memory devices 111, 112, and 119, rather, it is likely that an undetectable and uncorrectable error may occur.

Figure 7:
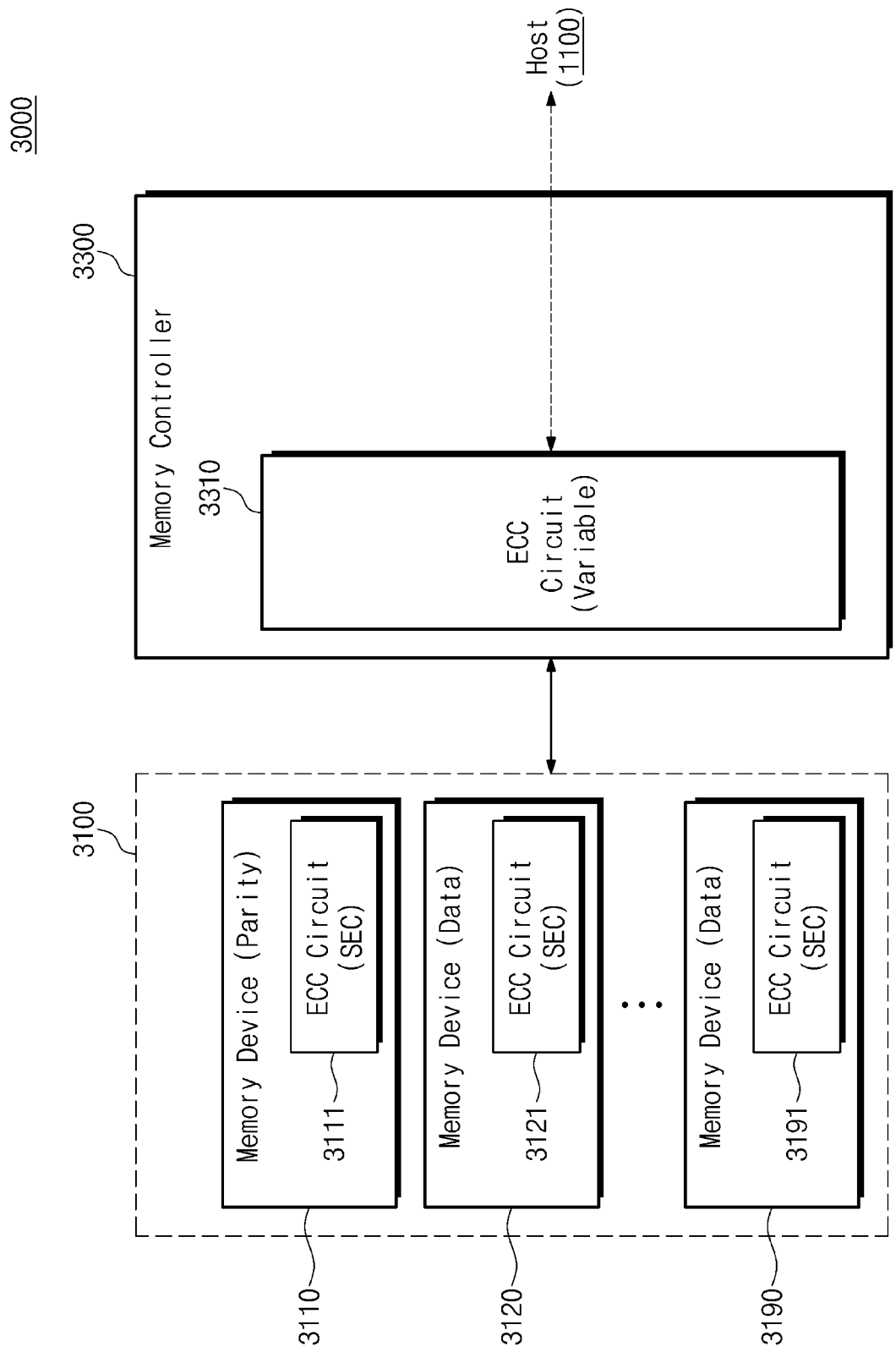
FIG. 7 is a block diagram illustrating an example configuration associated with a memory system of FIG. 3.

FIG. 7 is a block diagram illustrating an example configuration associated with the memory system 2000 of FIG. 3.

For example, the memory system 2000 may include a configuration such as the memory system 3000 of FIG. 7. One or more memory devices 3100 of FIG. 7 may correspond to the one or more memory devices 2100 of FIG. 3, and a memory controller 3300 of FIG. 7 may correspond to the memory controller 2300 of FIG. 3. For brevity, redundant descriptions associated with the memory devices 3100 and the memory controller 3300 will be omitted below.

Memory devices 3110, 3120, and 3190 may respectively include ECC circuits 3111, 3121, and 3191 as the internal function circuits 2111, 2121, and 2191. Each of the ECC circuits 3111, 3121, and 3191 may perform a first error processing operation (e.g., error detection and error correction) based on data stored in the respective memory devices 3110, 3120, and 3190, in compliance with a given ECC scheme. The memory devices 3110, 3120, and 3190 may perform the first error processing operation to generate first processed data.

For example, each of the ECC circuits 3111, 3121, and 3191 may operate in the SEC manner. In this case, each of the ECC circuits 3111, 3121, and 3191 may detect and correct a 1-bit error of data stored in the respective memory devices 3110, 3120, and 3190, but may not be able to detect an error of two or more bits.

In some example embodiments, the memory devices 3120 and 3190 may be provided to store data. Meanwhile, the memory device 3110 may be provided to store parity which is referenced to process an error of data stored in the memory devices 3120 and 3190. This configuration will be described with reference to FIG. 8.

For example, the memory controller 3300 may include a variable ECC circuit 3310 as the external variable function circuit 2310. The variable ECC circuit 3310 may perform a second error processing operation (e.g., error detection and/or error correction) based on the first processed data. The memory controller 3300 may perform the second error processing operation to generate second processed data. The variable ECC circuit 3310 may be configured to operate in several different manners, and detailed operations will be described with reference to FIGS. 9 to 11.

The memory controller 3300 may receive status information associated with performing the first error processing operation in the memory devices 3110, 3120, and 3190. For example, the status information may include information associated with at least one of various factors, e.g., whether the memory devices 3110, 3120, and 3190 include the ECC circuits 3111, 3121, and 3191 (i.e., whether each of the memory devices 3110, 3120, and 3190 supports the first error processing operation), a condition of each of the memory devices 3110, 3120, and 3190 where the first error processing operation is performed, parity for error processing, and/or the like.

For example, the status information may include information associated with whether performing the first error processing operation in each of the memory devices 3110, 3120, and 3190 is enabled. The ECC circuits 3111, 3121, and 3191 may be enabled or disabled in association with the status information. For example, the ECC circuits 3111, 3121, and 3191 may be enabled or disabled according to an operation policy of the memory system 3000 and/or the host 1100, and the status information may indicate the enable/disable of the ECC circuits 3111, 3121, and 3191.

A manner of the second error processing operation of the variable ECC circuit 3310 may vary based on the status information. For example, the variable ECC circuit 3310 may perform the second error processing operation of a first manner or the second error processing operation of a second manner, based on the status information.

For stable and reliable data processing, the ECC circuits 3111, 3121, and 3191 may be employed together with the ECC circuit 3310. In some cases, capability of the ECC circuit 3310 may be higher than capability of each of the ECC circuits 3111, 3121, and 3191. For example, the maximum number of errors which is detectable by the second error processing operation with regard to the first processed data may be greater than the maximum number of errors which is detectable by the first error processing operation with regard to the data stored in the memory devices 3110, 3120, and 3190.

Figure 8:
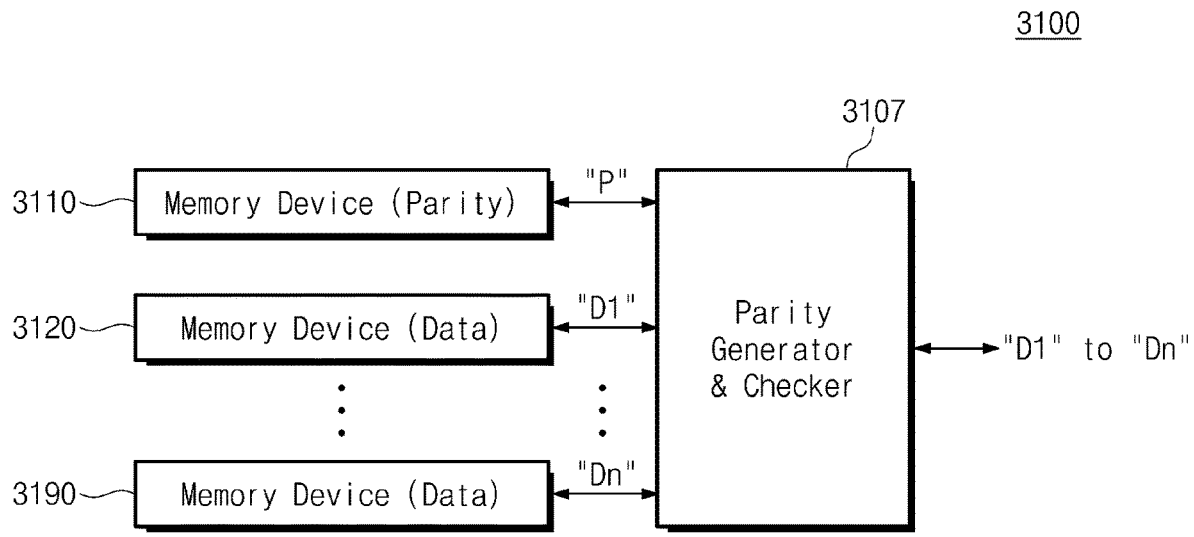
FIG. 8 is a block diagram for describing an example operation of storing and outputting data by using parity in memory devices of FIG. 7.

FIG. 8 is a block diagram for describing an example operation of storing and outputting data by using parity in the memory devices 3100 of FIG. 7.

In some example embodiments, a parity generator and checker 3107 may be provided for the memory devices 3110, 3120, and 3190. The parity generator and checker 3107 may perform a parity operation on data D1 to Dn provided to the memory devices 3110, 3120, and 3190.

The parity generator and checker 3107 may perform the parity operation to generate parity P corresponding to the data D1 to Dn. The parity P may be referenced to process an error. For example, the parity P may be even parity or odd parity. The memory devices 3120 and 3190 may store the data D1 to Dn, and meanwhile the memory device 3110 may store the parity P.

When the data D1 to Dn is output from the memory devices 3120 and 3190, the parity P may also be output from the memory device 3110. The parity generator and checker 3107 may detect and correct an error of the data D1 to Dn with reference to the parity P. The parity generator and checker 3107 may correct the detected error to output the data D1 to Dn without the error.

Figure 9:
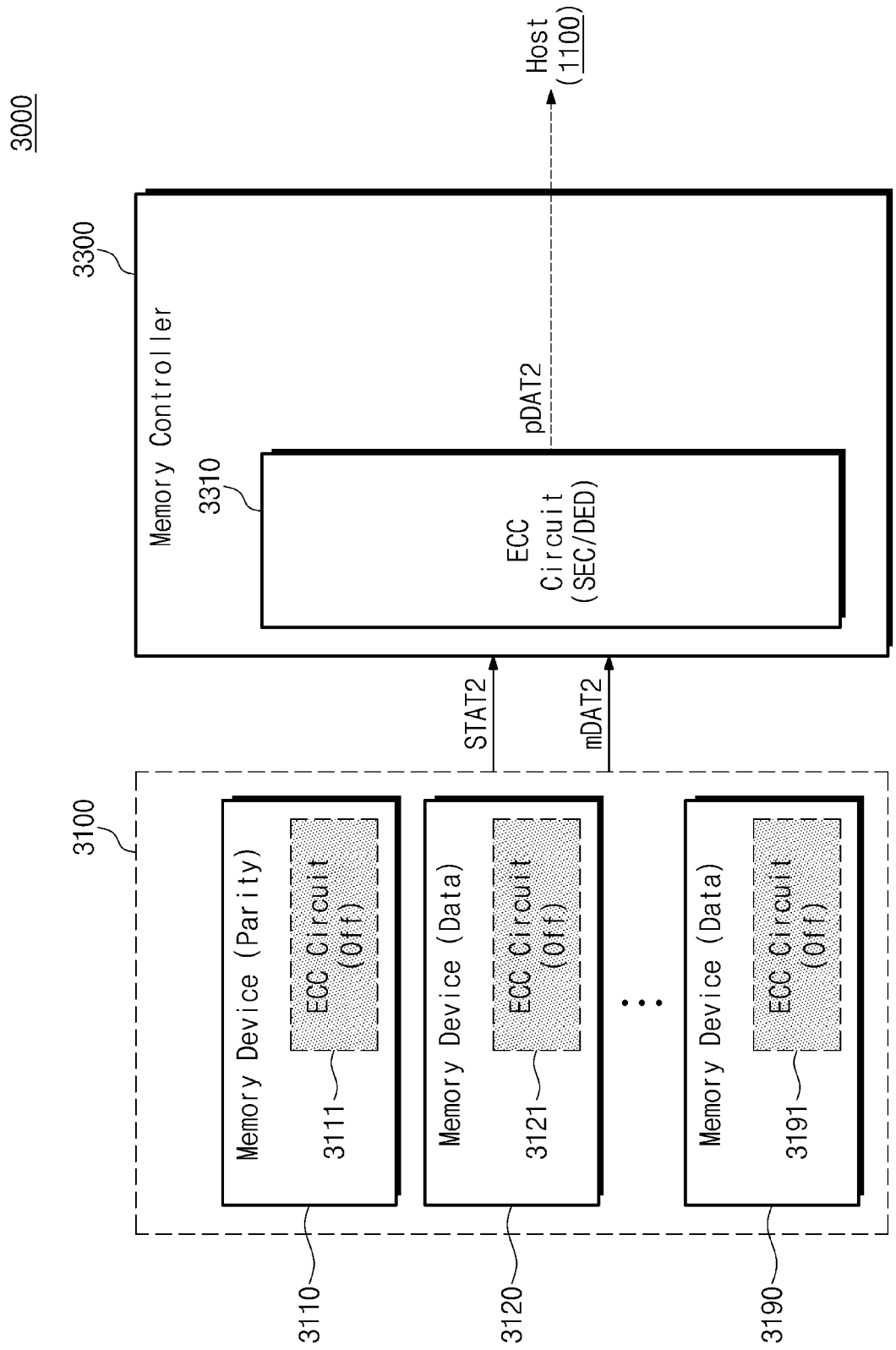
FIGS. 9 and 10 are block diagrams for describing example operations of a memory controller, which vary based on status information in a memory system of FIG. 7.
Figure 10:
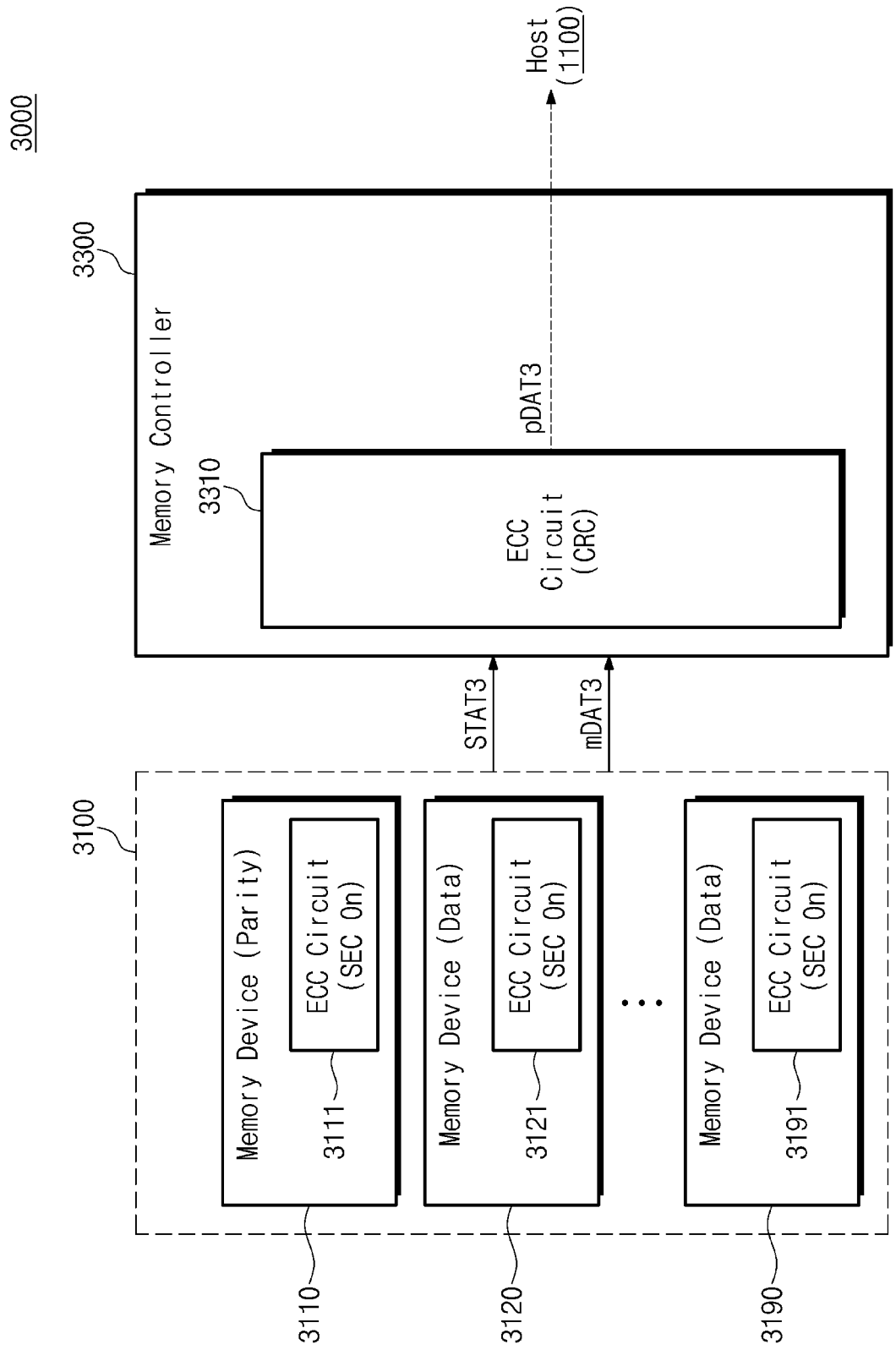

FIGS. 9 and 10 are block diagrams for describing example operations of the memory controller 3300, which vary based on status information in the memory system 3000 of FIG. 7.

Referring to FIG. 9, in some cases, performing the first error processing operation may be disabled (e.g., the ECC circuits 3111, 3121, and 3191 may be disabled). The ECC circuits 3111, 3121, and 3191 may be disabled according to an operation policy of the memory system 3000 and/or the host 1100. In this case, status information STAT2 received in the memory controller 3300 may indicate that performing the first error processing operation is not enabled.

In some other cases, the memory system 3000 may be designed such that the memory devices 3110, 3120, and 3190 do not include the ECC circuits 3111, 3121, and 3191. In this case, the status information STAT2 received in the memory controller 3300 may indicate that the memory devices 3110, 3120, and 3190 do not support the first error processing operation.

The memory devices 3110, 3120, and 3190 may generate first processed data mDAT2. In the example of FIG. 9, the first processed data mDAT2 may be provided to the memory controller 3300 without being processed by the ECC circuits 3111, 3121, and 3191.

The variable ECC circuit 3310 may perform the second error processing operation of the first manner which is selected based on the status information STAT2. The memory controller 3300 may perform the second error processing operation of the first manner based on the first processed data mDAT2, to generate second processed data pDAT2.

In the second error processing operation of the first manner of the variable ECC circuit 3310, the memory controller 3300 may correct the first number of errors and may detect the second number of errors with regard to the first processed data mDAT2. For example, the second number may be greater than the first number. For example, the variable ECC circuit 3310 may perform the second error processing operation in the SEC/DED manner such that one (1) error bit is corrected and two (2) error bits are detected.

As described with reference to FIG. 6, when the memory devices 3110, 3120, and 3190 are configured without the ECC circuits 3111, 3121, and 3191 of the SEC manner, the variable ECC circuit 3310 which operates in the SEC/DED manner may correct or detect an error of the first processed data mDAT2. Accordingly, when the status information STAT2 indicates that performing the first error processing operation is not enabled or indicates that the first error processing operation is not supported, the variable ECC circuit 3310 may operate in the first manner (e.g., in the SEC/DED manner).

Referring to FIG. 10, in some cases, performing the first error processing operation may be enabled (e.g., the ECC circuits 3111, 3121, and 3191 may be enabled). The ECC circuits 3111, 3121, and 3191 may be enabled according to an operation policy of the memory system 3000 and/or the host 1100. In this case, status information STAT5 received in the memory controller 3300 may indicate that performing the first error processing operation is enabled. The memory devices 3110, 3120, and 3190 may perform the first error processing operation to generate first processed data mDAT3.

The variable ECC circuit 3310 may perform the second error processing operation of the second manner which is selected based on the status information STAT3. The memory controller 3300 may perform the second error processing operation of the second manner based on the first processed data mDAT3, to generate second processed data pDAT3.

In the second error processing operation of the second manner of the variable ECC circuit 3310, the memory controller 3300 may perform error detection without error correction with regard to the first processed data mDAT3. For example, the variable ECC circuit 3310 may perform the second error processing operation in a cyclic redundancy check (CRC) manner such that three or more error bits are detected without error correction. For example, the variable ECC circuit 3310 which operates in the CRC manner may detect a first bit location error, a second bit location error, an odd bit location error, a burst error, and/or the like.

As described with reference to FIG. 6, when the memory devices 3110, 3120, and 3190 are configured together with the ECC circuits 3111, 3121, and 3191 of the SEC manner, it is likely that an error which is undetectable and uncorrectable by the SEC/DED manner may occur. In this case, it may be advantageous to detect more errors even though error correction capability is abandoned. Accordingly, when the status information STAT3 indicates that performing the first error processing operation is enabled, the variable ECC circuit 3310 may operate in the second manner (e.g., in the CRC manner) to detect more errors.

The maximum number of errors which is detectable by the second error processing operation of the second manner with regard to the first processed data mDAT3 may be greater than the maximum number of errors which is detectable by the second error processing operation of the first manner with regard to the first processed data mDAT2. According to these example embodiments, stability, reliability, and flexibility of an operation of the memory system 3000 may be improved, and an undetectable and uncorrectable error may be prevented from occurring.

In association with the first operation, the status information STAT2 may be changed to the status information STAT3 or vice versa. For example, when the status information STAT2 is changed from the status information STAT3, context of the first processed data mDAT2 may be changed to context of the first processed data mDAT3. In addition, context of the second processed data pDAT2 may be changed to context of the second processed data pDAT3.

Figure 11:
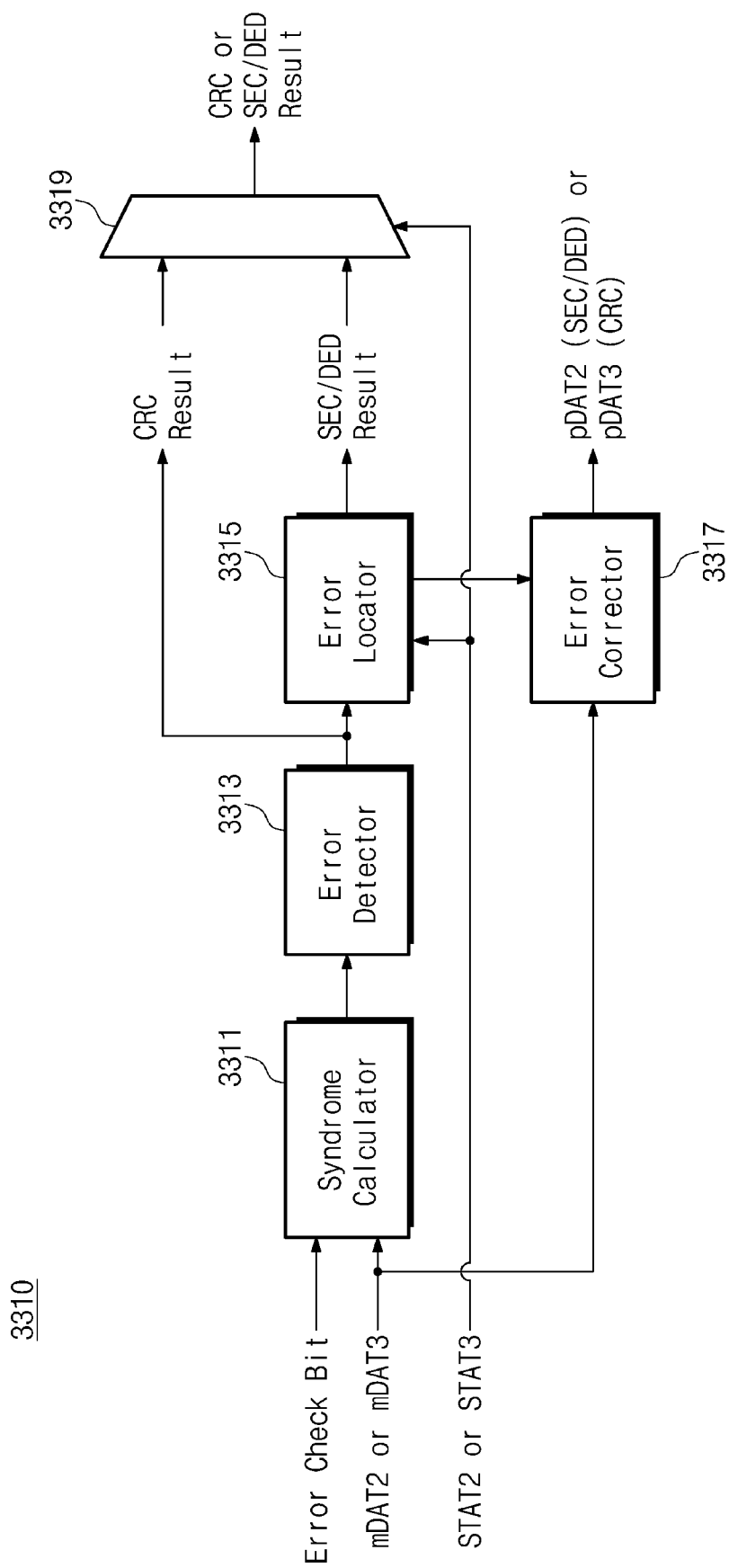
FIG. 11 is a block diagram illustrating an example configuration of a variable error correction code (ECC) circuit of FIG. 7.

FIG. 11 is a block diagram illustrating an example configuration of the variable ECC circuit 3310 of FIG. 7.

In some example embodiments, the variable ECC circuit 3310 may include a syndrome calculator 3311, an error detector 3313, an error locator 3315, an error corrector 3317, and a switch 3319. The variable ECC circuit 3310 may receive the first processed data mDAT2 or mDAT3 and the status information STAT2 or STAT3. The variable ECC circuit 3310 may receive an error check bit, which has been generated by an ECC encoding operation when data has been stored in the memory devices 3110, 3120, and 3190.

The syndrome calculator 3311 may calculate a syndrome based on the first processed data mDAT2 or mDAT3 and the error check bit. An operation of calculating the syndrome and detecting and correcting an error based on the calculated syndrome is readily understood, and thus detailed descriptions thereof will be omitted below.

The error detector 3313 may detect an error associated with the first processed data mDAT2 or mDAT3 based on the calculated syndrome. The error locator 3315 may calculate a location of a bit, which corresponds to the detected error, from among bits of a bit string associated with the first processed data mDAT2. The error corrector 3317 may correct a value of the bit of the calculated location with regard to the first processed data mDAT2. The error locator 3315 may be enabled or disabled based on the status information STAT2 or STAT3.

For example, the error locator 3315 may be enabled based on the status information STAT2 which indicates the disable or absence of the first error processing operation. In this example, the error locator 3315 may calculate a location of an error bit with regard to the first processed data mDAT2, and may output a result of the second error processing operation of the first manner (e.g., the SEC/DED manner). The error corrector 3317 may correct the error bit of the calculated location with regard to the first processed data mDAT2, to output the second processed data pDAT2.

The switch 3319 may output the result of the second error processing operation of the first manner (e.g., the SEC/DED manner) in response to the status information STAT2. Accordingly, when the error locator 3315 is enabled, the variable ECC circuit 3310 may output the output from the error locator 3315 as the error detection result associated with the second error processing operation of the first manner. The error detection result may indicate whether an error occurs, the number of errors, a location of an error bit, whether an error is correctable, and/or the like.

On the other hand, the error locator 3315 may be disabled based on the status information STAT3 which indicates the enable of the first error processing operation. In this case, the error detector 3313 may detect an error associated with the first processed data mDAT3, and may output a result of the second error processing operation of the second manner (e.g., the CRC manner). The error corrector 3317 may output the second processed data pDAT3 without error correction, with regard to the first processed data mDAT3.

The switch 3319 may output the result of the second error processing operation of the second manner (e.g., the CRC manner) in response to the status information STAT3. In this case, calculating an error bit location and correcting an error bit of the calculated location may not be performed. The variable ECC circuit 3310 may output the output from the error detector 3313 as the error detection result associated with the second error processing operation of the second manner. The error detection result may indicate whether an error occurs, the number of errors, and/or the like.

As such, the memory controller 3300 may output the error detection result according to the second error processing operation. When the manner of the second error processing operation is changed, the error detection result may be changed. The error detection result may be provided to the host 1100. For example, the error detection result may be included in the second processed data pDAT2 or pDAT3 to be provided to the host 1100, or may be provided to the host 1100 in any other way.

In the example of FIG. 11, the memory controller 3300 may selectively perform the second error processing operation of the first manner or the second error processing operation of the second manner based on the status information STAT2 or STAT3, by using only the variable ECC circuit 3310 without an additional ECC circuit. Accordingly, the variable ECC circuit 3310 may not require an additional circuit area.

In the examples of FIGS. 7 to 11, it has been described that manners of the error processing operation include the SEC manner, the SEC/DED manner, and the CRC manner. However, these examples are provided to facilitate understanding, and are not intended to limit the present disclosure. For example, the memory devices 3110, 3120, and 3190 and the memory controller 3300 may employ error processing operations of various manners such as a double error correction (DEC) manner, a double error correction/triple error detection (DEC/TED) manner, a checksum manner, a hash function manner, and/or the like.

In addition, it has been described that the operation of the variable ECC circuit 3310 varies depending on the status information STAT2 or STAT3 which indicates status of the first error processing operation. However, the operation of the variable ECC circuit 3310 may vary depending on other information.

For example, when a temperature of the memory devices 3110, 3120, and 3190 exceeds a reference temperature and excessively increases or an expected remaining lifespan of the memory devices 3110, 3120, and 3190 is shorter than a reference lifespan, it is likely that an error may occur in data stored in the memory devices 3110, 3120, and 3190. Accordingly, the operation of the variable ECC circuit 3310 may vary depending on status information which indicates a temperature or a remaining lifespan of the memory devices 3110, 3120, and 3190. As such, example embodiments may be variously changed or modified, and are not limited to the above-described examples.

Figure 12:
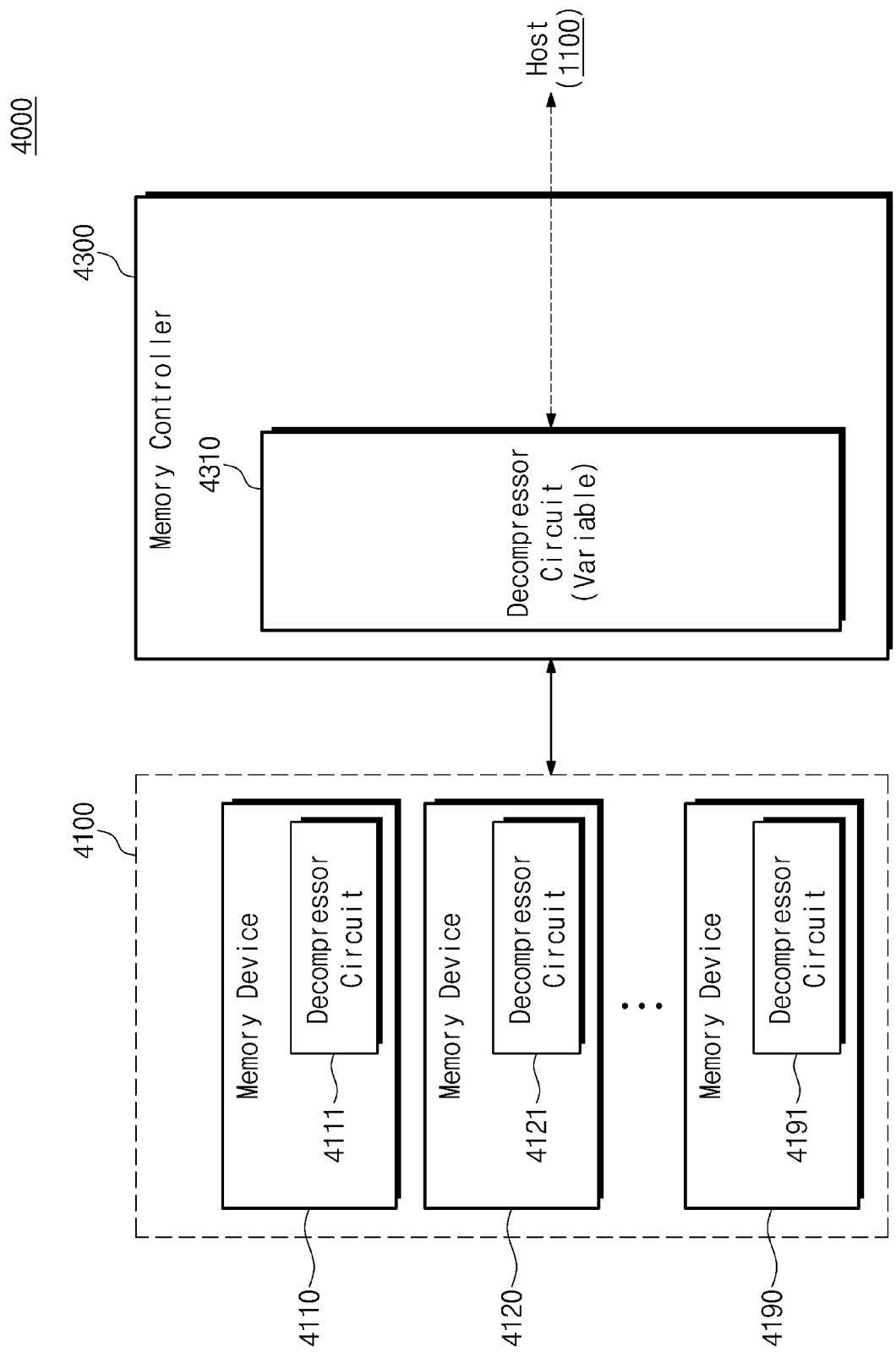
FIG. 12 is a block diagram illustrating an example configuration associated with a memory system of FIG. 3.

FIG. 12 is a block diagram illustrating an example configuration associated with the memory system 2000 of FIG. 3.

For example, the memory system 2000 may include a configuration such as a memory system 4000 of FIG. 12. One or more memory devices 4100 of FIG. 12 may correspond to the one or more memory devices 2100 of FIG. 3, and a memory controller 4300 of FIG. 12 may correspond to the memory controller 2300 of FIG. 3. For brevity, redundant descriptions associated with the memory devices 4100 and the memory controller 4300 will be omitted below.

Memory devices 4110, 4120, and 4190 may respectively include decompressor circuits 4111, 4121, and 4191 as the internal function circuits 2111, 2121, and 2191. Each of the decompressor circuits 4111, 4121, and 4191 may perform a first decompression operation based on data stored in the respective memory devices 4110, 4120, and 4190, in compliance with a given decompression scheme.

For example, when data is stored in the memory devices 4110, 4120, and 4190, data may be compressed to store a larger amount of data. The first decompression operation may be performed on the compressed data, and thus decompressed data may be output from the memory devices 4110, 4120, and 4190. The memory devices 4110, 4120, and 4190 may perform the first decompression operation to generate first processed data.

For example, the memory controller 4300 may include a variable decompressor circuit 4310 as the external variable function circuit 2310. The variable decompressor circuit 4310 may perform a second decompression operation based on the first processed data, in compliance with a given decompression scheme. The memory controller 4300 may perform the second decompression operation to generate second processed data.

For example, the first decompression operation of the decompressor circuits 4111, 4121, and 4191 may provide partial decompression of data, and the second decompression operation of the variable decompressor circuit 4310 may provide the remaining decompression of the data. For example, the first decompression operation may decompress a first portion of compressed data, and the second decompression operation may decompress a second portion (e.g., the remaining portion) of the compressed data. As the decompressor circuits 4111, 4121, and 4191 perform partial decompression, a load of the memory controller 4300 may be relieved.

The memory controller 4300 may receive status information associated with performing the first decompression operation in the memory devices 4110, 4120, and 4190. For example, the status information may include information associated with at least one of various factors, e.g., whether the memory devices 4110, 4120, and 4190 include the decompressor circuits 4111, 4121, and 4191 (i.e., whether each of the memory devices 4110, 4120, and 4190 supports the first decompression operation), whether performing the first decompression operation in each of the memory devices 4110, 4120, and 4190 is enabled, a condition of each of the memory devices 4110, 4120, and 4190 where the first decompression operation is performed, a manner of the first decompression operation, and/or the like.

A manner (e.g., a scheme, performance, and/or the like) of the second decompression operation of the variable decompressor circuit 4310 may vary based on the status information. For example, the variable decompressor circuit 4310 may selectively perform the second decompression operation of a first manner or the second decompression operation of a second manner, based on the status information.

Figure 13:
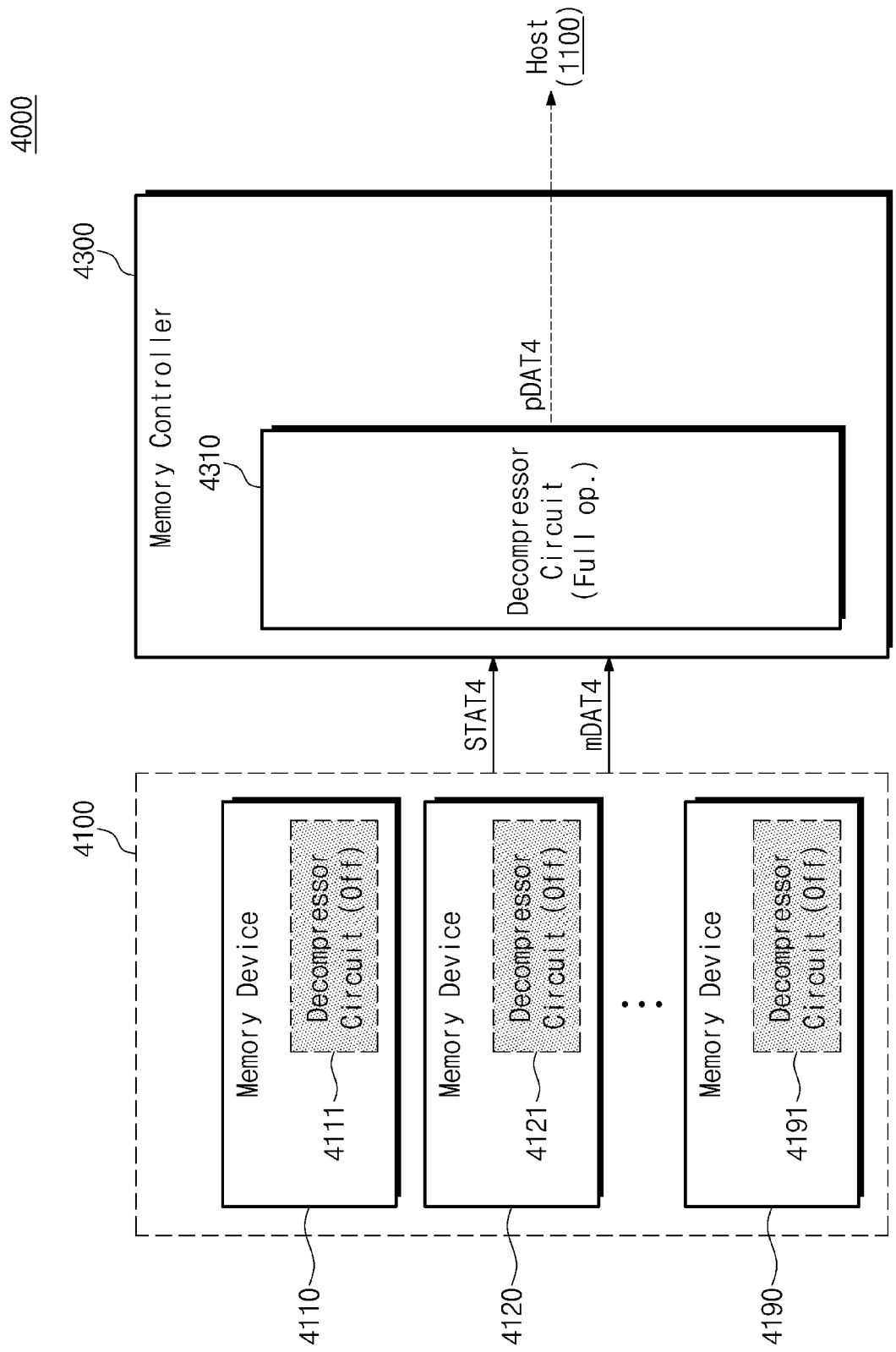
FIGS. 13 and 14 are block diagrams for describing example operations of a memory controller, which vary based on status information in a memory system of FIG. 12.
Figure 14:
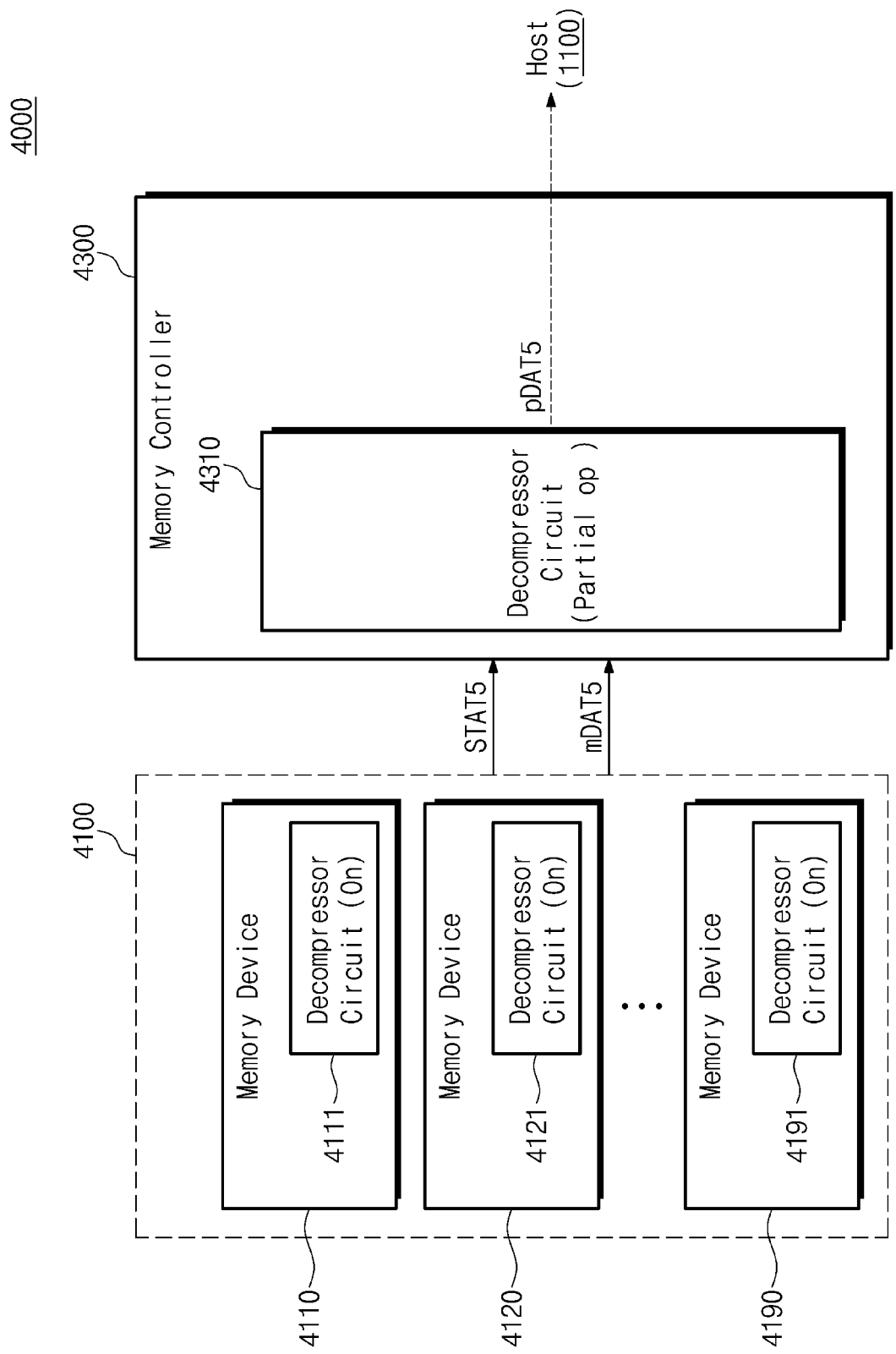

FIGS. 13 and 14 are block diagrams for describing example operations of the memory controller 4300, which vary based on status information in the memory system 4000 of FIG. 12.

Referring to FIG. 13, in some cases, performing the first decompression operation may be disabled (e.g., the decompressor circuits 4111, 4121, and 4191 may be disabled). The decompressor circuits 4111, 4121, and 4191 may be disabled according to an operation policy of the memory system 4000 and/or the host 1100. In this case, status information STAT4 received in the memory controller 4300 may indicate that performing the first decompression operation is not enabled.

The memory devices 4110, 4120, and 4190 may generate first processed data mDAT4. In the example of FIG. 13, the first processed data mDAT4 may be provided to the memory controller 4300 without being processed by the decompressor circuits 4111, 4121, and 4191.

The variable decompressor circuit 4310 may perform the second decompression operation of the first manner which is selected based on the status information STAT4. The memory controller 4300 may perform the second decompression operation of the first manner based on the first processed data mDAT4, to generate second processed data pDAT4. For example, in the second decompression operation of the first manner of the variable decompressor circuit 4310, the memory controller 4300 may fully operate to provide maximum performance.

Referring to FIG. 14, in some cases, performing the first decompression operation may be enabled (e.g., the decompressor circuits 4111, 4121, and 4191 may be enabled). The decompressor circuits 4111, 4121, and 4191 may be enabled according to an operation policy of the memory system 4000 and/or the host 1100. In this case, status information STAT5 received in the memory controller 4300 may indicate that performing the first decompression operation is enabled. The memory devices 4110, 4120, and 4190 may perform the first decompression operation to generate first processed data mDAT5.

The variable decompressor circuit 4310 may perform the second decompression operation of the second manner which is selected based on the status information STAT5. The memory controller 4300 may perform the second decompression operation of the second manner based on the first processed data mDAT5, to generate second processed data pDAT5. For example, in the second decompression operation of the second manner of the variable decompressor circuit 4310, the memory controller 4300 may partially operate to provide low performance.

Figure 15:
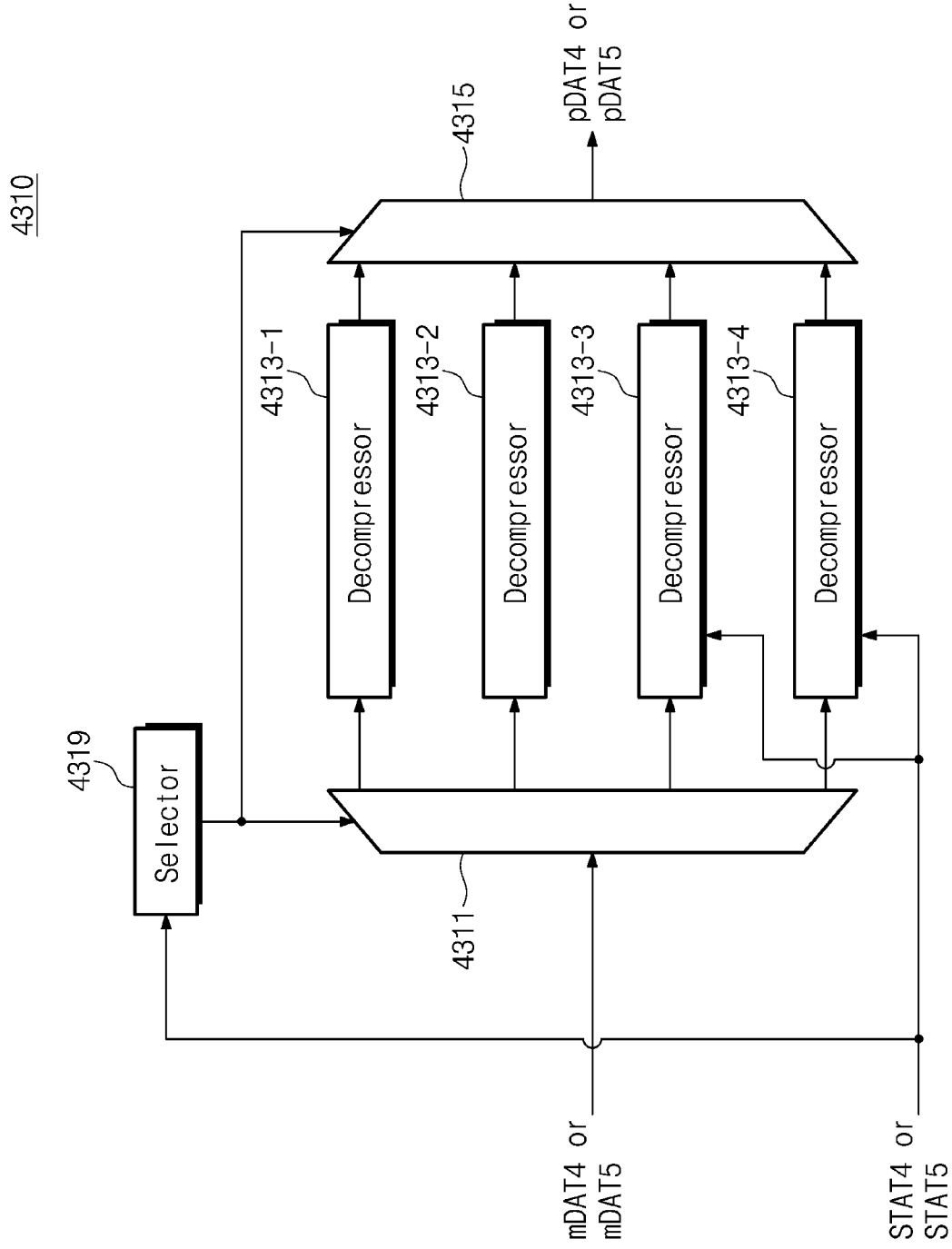
FIG. 15 is a block diagram illustrating an example configuration of a variable decompressor circuit of FIG. 12.

FIG. 15 is a block diagram illustrating an example configuration of the variable decompressor circuit 4310 of FIG. 12.

In some example embodiments, the variable decompressor circuit 4310 may include switches 4311 and 4315, decompressors 4313-1, 4313-2, 4313-3, and 4313-4, and a selector 4319. The variable decompressor circuit 4310 may receive the first processed data mDAT4 or mDAT5 and the status information STAT4 or STAT5.

The decompressors 4313-1, 4313-2, 4313-3, and 4313-4 may perform the second decompression operation in parallel. The decompressors 4313-1, 4313-2, 4313-3, and 4313-4 may perform the second decompression operation based on the first processed data mDAT4 or mDAT5. The selector 4319 may output a selection signal to make the decompressors 4313-1, 4313-2, 4313-3, and 4313-4 operate sequentially and/or alternately.

The switch 4311 may transfer the first processed data mDAT4 or mDAT5 to a decompressor which selected in response to the selection signal. The switch 4315 may receive data from the decompressor selected in response to the selection signal, and may output the received data as the second processed data pDAT4 or pDAT5.

For example, the decompressors 4313-3 and 4313-4 may be enabled or disabled based on the status information STAT4 or STAT5. For example, the decompressors 4313-3 and 4313-4 may be enabled based on the status information STAT4 which indicates the disable or absence of the first decompression operation. In this example, the variable decompressor circuit 4310 may perform the second decompression operation of the first manner (e.g., a full operation) such that all the decompressors 4313-1, 4313-2, 4313-3, and 4313-4 operate in parallel, and may generate the second processed data pDAT4 based on the first processed data mDAT4.

On the other hand, the decompressors 4313-3 and 4313-4 may be disabled based on the status information STAT5 which indicates the enable of the first decompression operation. In this example, the variable decompressor circuit 4310 may perform the second decompression operation of the second manner (e.g., a partial operation) such that only the decompressors 4313-1 and 4313-2 operate in parallel, and may generate the second processed data pDAT5 based on the second processed data mDAT5.

As such, the memory controller 4300 may operate to be suitable for a given condition or status, and flexibility of an operation of the memory system 4000 may be improved. As the memory devices 4110, 4120, and 4190 partially process an operation to be performed in the memory controller 4300, load of the memory controller 4300 may be relieved. Accordingly, operation performance and power consumption may be optimally managed.

The example embodiments of FIGS. 7 to 15 may be associated with implementations where a type of a first operation performed in the memory devices 2110, 2120, and 2190 is identical to a type of a second operation performed in the memory controller 2300. Also, the example embodiments of FIGS. 7 to 15 may be associated with implementations where one type of the second operation is performed in the memory controller 2300. However, these example embodiments are provided to facilitate better understanding, and are not intended to limit the present disclosure. It may be readily understood that example embodiments may be variously employed to vary the second operation based on the status information STAT, even in an implementation where a type of the first operation is different from a type of the second operation and an implementation where a plurality of types of second operations are performed.

Figure 16:
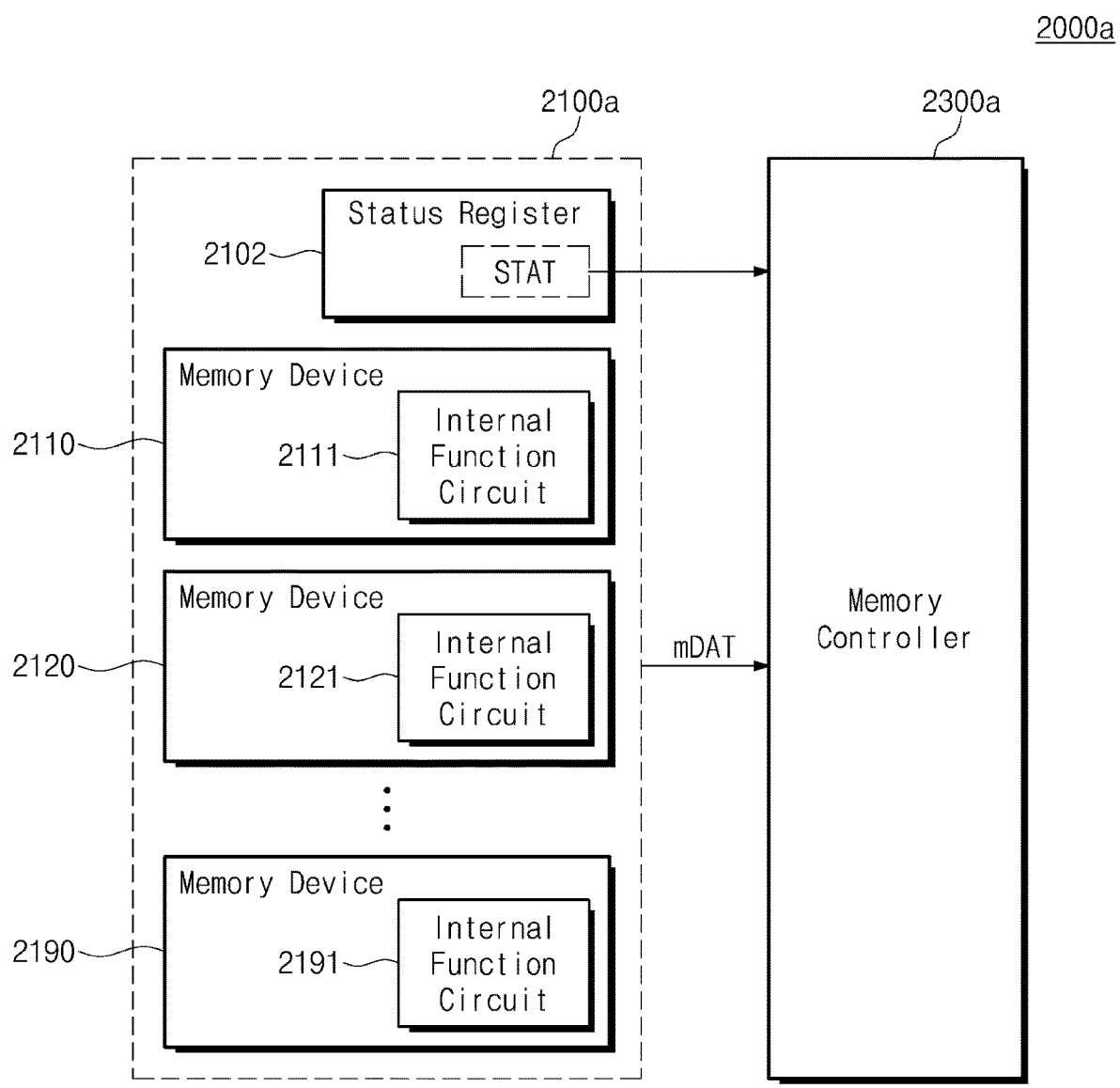
FIGS. 16 to 18 are block diagrams illustrating example configurations for providing status information from a memory system to a memory controller of FIG. 3.
Figure 17:
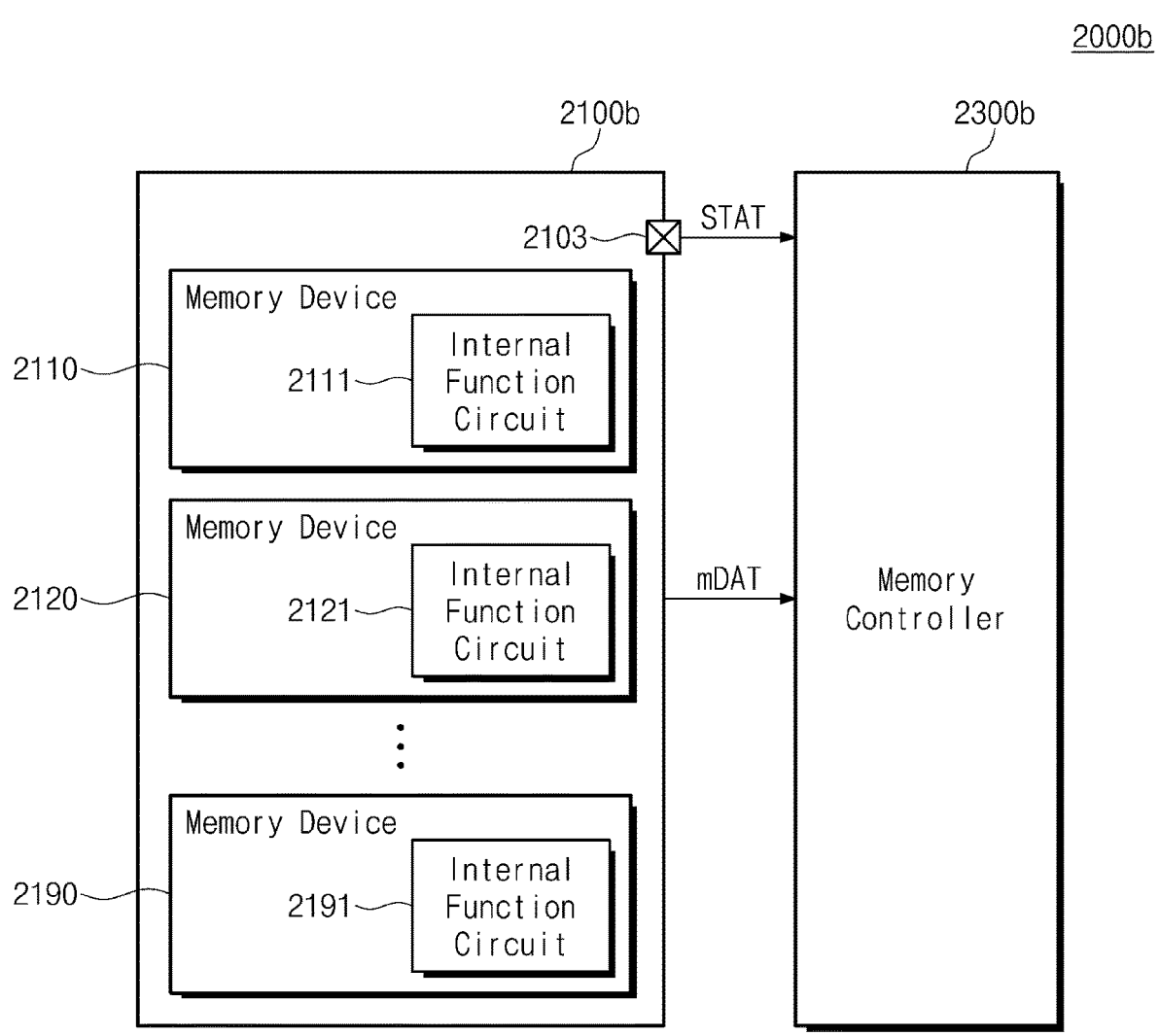
Figure 18:
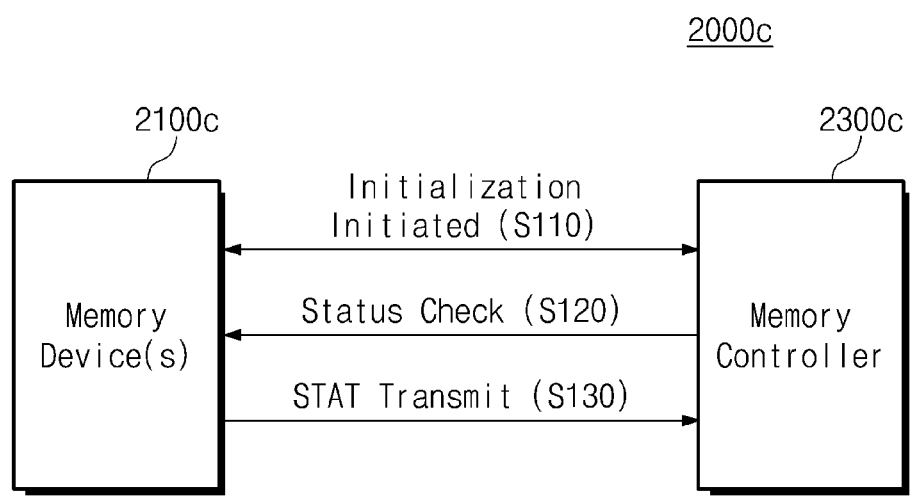

FIGS. 16 to 18 are block diagrams illustrating example configurations for providing the status information STAT from the memory system 2000 to the memory controller 2300 of FIG. 3.

In some example embodiments, the memory system 2000 may include a configuration such as a memory system 2000*a* of FIG. 16. Referring to FIG. 16, the memory system 2000 may further include a status register 2102. The status register 2102 may store the status information STAT, and may manage and update the status information STAT with regard to performing the first operation in one or more memory devices 2100*a*.

A memory controller 2300*a* may receive the status information STAT from the status register 2102. To this end, the memory controller 2300*a* may directly access the status register 2102. Alternatively, the status register 2102 may output the status information STAT in response to a request of the memory controller 2300*a*.

In some example embodiments, the memory system 2000 may include a configuration such as a memory system 2000*b* of FIG. 17. Referring to FIG. 17, the memory devices 2110, 2120, and 2190 may be disposed on a printed circuit board or semiconductor package 2100*b*. The printed circuit board or semiconductor package 2100*b* may include a connection terminal 2103.

The connection terminal 2103 may be implemented in a form of a pad or a pin. The connection terminal 2103 may output a signal which corresponds to the status information STAT. The signal corresponding to the status information STAT may be provided from the memory devices 2110, 2120, and 2190 or other circuit on the printed circuit board or semiconductor package 2100*b*. A memory controller 2300*b* may be connected to the connection terminal 2103 and may receive the signal which corresponds to the status information STAT.

In some example embodiments, the memory system 2000 may include a configuration as a memory system 2000*c* of FIG. 18. Referring to FIG. 18, a communication sequence may be defined to transfer the status information STAT between one or more memory devices 2100*c* and a memory controller 2300*c*.

For example, when the memory devices 2100*c* and the memory controller 2300*c* are physically connected or when communication between the memory devices 2100*c* and the memory controller 2300*c* is reset, a connection initialization operation may be performed (S110). Afterwards, the memory controller 2300*c* may transmit a status check request to the memory devices 2100*c* (S120). The memory devices 2100*c* may transmit the status information STAT to the memory controller 2300*c* in response to the status check request received from the memory controller 2300*c* (S130).

Each of the status check request and the status information STAT may be transmitted in a form of a signal or a packet. The status check request and the status information STAT may be transmitted by being included in a reserved field of a command and a response which are defined in the existing communication protocol. Alternatively, a command and a response may be newly defined to transmit the status check request and the status information STAT.

Figure 19:
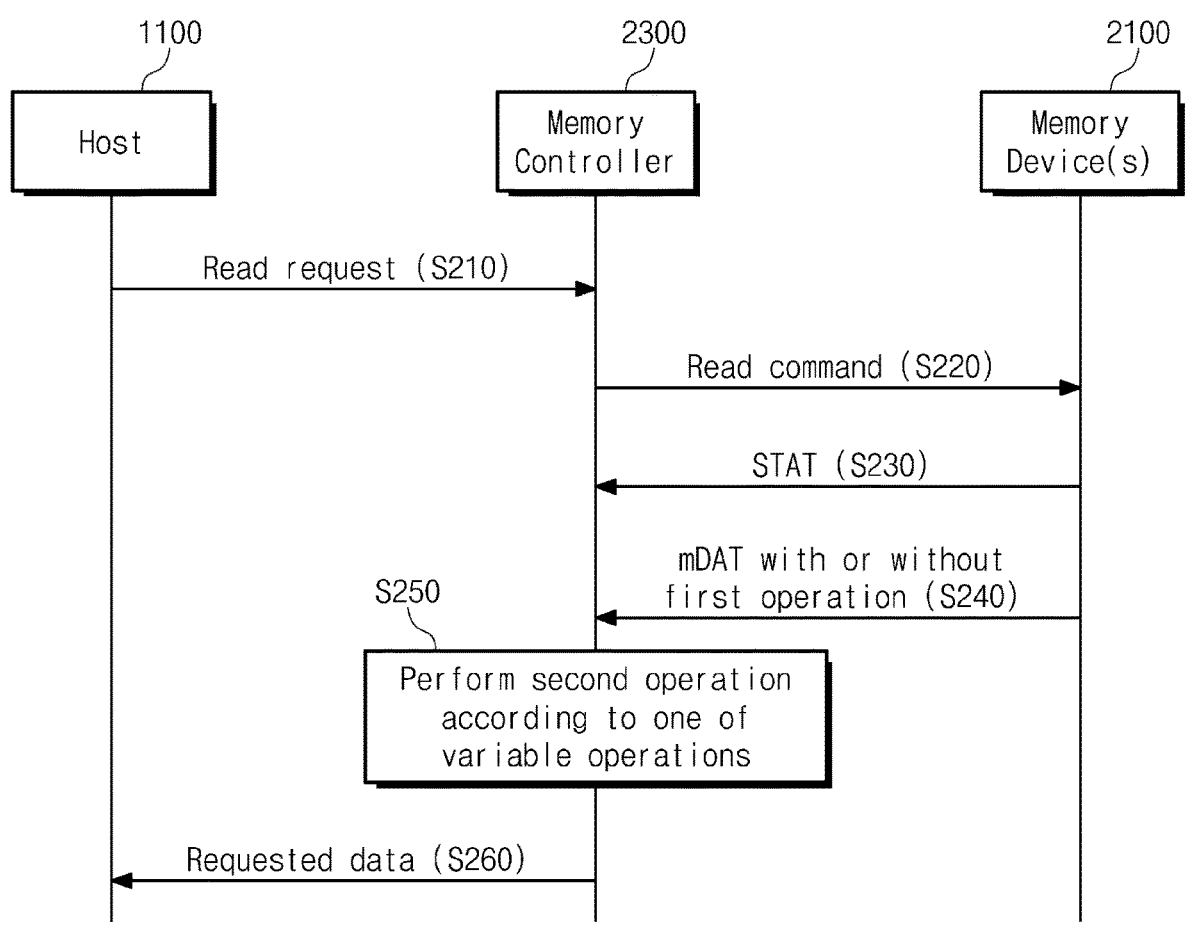
FIG. 19 is a flowchart describing an example operation associated with a memory system of FIG. 3.

FIG. 19 is a flowchart describing an example operation associated with the memory system 2000 of FIG. 3.

The host 1100 may transmit a read request to the memory controller 2300 (S210). The memory controller 2300 may transmit a read command to the memory devices 2100 in response to the read request (S220). The read request and the read command may be generated to read data stored in the memory devices 2100.

The memory controller 2300 may receive the status information STAT (S230). In addition, the memory controller 2300 may receive the first processed data mDAT (S240). The first processed data mDAT may be generated from the first operation performed in the memory devices 2100 or may be generated without the first operation.

FIG. 19 illustrates that the status information STAT is transferred after the read command is transmitted. However, the present disclosure is not limited to illustration of FIG. 19. The status information STAT may be transferred in advance before the read request or the read command is transmitted. For example, the status information STAT may be transferred during or after the connection initialization operation between the host 1100 and the memory controller 2300.

Afterwards, the memory controller 2300 may perform the second operation (S250). The second operation may be performed according to one operation, which is selected based on the status information STAT, from among several variable operations. For example, a type of the second operation or a manner of the second operation may vary based on the status information STAT. The memory controller 2300 may output (S260) requested data to the host 1100, based on a result of the second operation (e.g., based on the second processed data pDAT generated by the second operation).

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

The above descriptions are intended to provide example configurations and operations for implementing the present disclosure. The scope and spirit of the present disclosure may include implementations which are obtained by simply changing or modifying the above example embodiments, in addition to the above-described example embodiments. Also, the scope and spirit of the present disclosure includes implementations which are accomplished by easily changing or modifying the above-described example embodiments afterwards.

What is claimed is:

1. A memory system comprising:
   a memory device that performs a first error processing operation based on stored data to generate first processed data; and
   a memory controller that:
      receives status information associated with performing the first error processing operation, and
      performs a second error processing operation based on the first processed data to generate second processed data, wherein:
   a maximum number of errors detectable by the second error processing operation with regard to the first processed data is greater than a maximum number of errors detectable by the first error processing operation with regard to the stored data, and
   a manner of the second error processing operation varies based on the status information.

2. The memory system of claim 1, wherein the status information indicates whether the memory device supports the first error processing operation, whether performing the first error processing operation is enabled, a condition of the memory device where the first error processing operation is performed, or parity referenced in error processing.

3. The memory system of claim 1, wherein the memory controller:
   performs the second error processing operation of a first manner when the status information indicates that the memory device does not support the first error processing operation or that performing the first error processing operation is not enabled, and
   performs the second error processing operation of a second manner when the status information indicates that performing the first error processing operation is enabled.

4. The memory system of claim 3, wherein:
   the memory controller performs the second error processing operation of the first manner, such that a first number of errors is corrected and a second number of errors is detected with regard to the first processed data, and
   the second number of errors is greater than the first number of errors.

5. The memory system of claim 3, wherein the memory controller performs the second error processing operation of the second manner, such that error detection is performed without error correction with regard to the first processed data.

6. The memory system of claim 3, wherein a maximum number of errors detectable by the second error processing operation of the second manner with regard to the first processed data is greater than a maximum number of errors detectable by the second error processing operation of the first manner with regard to the first processed data.

7. The memory system of claim 1, wherein:
   the memory controller outputs an error detection result according to the second error processing operation, and
   when the manner of the second error processing operation is changed, the error detection result is changed.

8. The memory system of claim 1, wherein:
   the memory device comprises a first error correction code (ECC) circuit which performs the first error processing operation, and
   the first ECC circuit is enabled or disabled in association with the status information.

9. The memory system of claim 1, wherein:
   the memory controller comprises a second ECC circuit which performs the second error processing operation, and
   the second ECC circuit performs the second error processing operation of a first manner or the second error processing operation of a second manner, based on the status information.

10. The memory system of claim 9, wherein:
    the second ECC circuit comprises:

a syndrome calculator that calculates a syndrome, based on the first processed data and an error check bit;
an error detector that detects an error with regard to the first processed data, based on the calculated syndrome;
an error locator that calculates a location of a bit, which corresponds to the detected error, from among bits of a bit string associated with the first processed data; and
an error corrector that corrects a value of the bit identified by the location with regard to the first processed data, and
the error locator is enabled or disabled based on the status information.

11. The memory system of claim 10, wherein the second ECC circuit:
outputs an output from the error locator as an error detection result associated with the second error processing operation of the first manner when the error locator is enabled, and
outputs an output from the error detector as an error detection result associated with the second error processing operation of the second manner when the error locator is disabled.

12. The memory system of claim 9, wherein the memory controller selectively performs the second error processing operation of the first manner or the second error processing operation of the second manner, based on the status information, by using the second ECC circuit without an additional ECC circuit.

13. A memory system comprising:
a memory device that performs a first operation based on stored data to generate first processed data; and
a memory controller that:
receives status information associated with performing the first operation, and
performs a second operation based on the first processed data to generate second processed data, wherein:
the first processed data is differently generated in the memory device in association with a change of the status information, and
a manner of the second operation varies based on the status information, and the second processed data is differently generated in the memory controller according to the change of the status information.

14. The memory system of claim 13, further comprising:
a status register that store the status information, wherein the memory controller receives the status information from the status register.

15. The memory system of claim 13, wherein:
the memory device is disposed on a printed circuit board or a semiconductor package,
the printed circuit board or the semiconductor package comprises a connection terminal for outputting a signal which corresponds to the status information, and the connection terminal is a pad or a pin, and
the memory controller is connected to the connection terminal to receive the signal corresponding to the status information.

16. The memory system of claim 13, wherein:
the memory device transmits the status information to the memory controller in response to a status check request received from the memory controller, and
each of the status check request and the status information is transmitted in a form of a signal or a packet.

17. The memory system of claim 13, wherein:
as a read request is received from a host, the memory device and the memory controller perform the first operation and the second operation respectively, and
the memory controller provides the host with requested data corresponding to the read request, based on the second processed data.

18. A memory system comprising:
a memory device; and
a memory controller that performs a function operation based on data received from the memory device, to generate processed data, wherein the memory controller:
receives status information associated with an operation performed in the memory device, and
performs the function operation in a manner, which is selected based on the status information, from among different manners, wherein
as the status information is changed, the data is changed.

19. The memory system of claim 18, wherein the manner of the function operation is determined according to at least one of a type or capability of the function operation.

20. The memory system of claim 18, wherein when the manner of the function operation is changed based on the status information, the processed data generated in the memory controller after the manner of the function operation is changed is different from the processed data generated in the memory controller before the manner of the function operation is changed.

* * * * *